United States Patent
Pompl

(10) Patent No.: US 8,143,659 B2
(45) Date of Patent: Mar. 27, 2012

(54) VERTICAL TRENCH CAPACITOR, CHIP COMPRISING THE CAPACITOR, AND METHOD FOR PRODUCING THE CAPACITOR

(75) Inventor: Stefan Pompl, Landshut (DE)

(73) Assignee: Infineon Technologies AG, Neubiberg (DE)

( * ) Notice: Subject to any disclaimer, the term of this patent is extended or adjusted under 35 U.S.C. 154(b) by 598 days.

(21) Appl. No.: 12/102,798

(22) Filed: Apr. 14, 2008

(65) Prior Publication Data

US 2009/0256239 A1    Oct. 15, 2009

(51) Int. Cl.
*H01L 27/108* (2006.01)
*H01L 29/94* (2006.01)

(52) U.S. Cl. ........ 257/301; 257/296; 257/302; 257/303; 257/535; 257/E29.346; 257/E21.396; 438/243; 438/245; 438/246; 438/249; 438/381; 438/386; 438/389; 438/390; 438/391; 438/392

(58) Field of Classification Search ................... 257/301, 257/296, 302, 303, 305, 516, 535, E29.346, 257/E21.396; 438/243, 245, 246, 249, 381, 438/386, 389, 390, 391, 392
See application file for complete search history.

(56) References Cited

U.S. PATENT DOCUMENTS

| 6,140,199 | A | 10/2000 | Larsson et al. |
| 7,030,457 | B2 * | 4/2006 | Ahrens et al. ................. 257/516 |
| 7,057,224 | B2 * | 6/2006 | Lindstedt et al. ............. 257/302 |
| 2005/0280060 | A1 * | 12/2005 | Juengling ..................... 257/296 |
| 2007/0018274 | A1 * | 1/2007 | Bonart et al. ................. 257/506 |
| 2007/0018748 | A1 * | 1/2007 | Smolders et al. ................. 333/1 |
| 2007/0096182 | A1 * | 5/2007 | Schloesser et al. ........... 257/296 |
| 2007/0296010 | A1 * | 12/2007 | Su et al. ......................... 257/301 |

FOREIGN PATENT DOCUMENTS

| DE | 10 2005 030 638 A1 | 1/2007 |
| JP | 2006261416 A * | 9/2006 |

OTHER PUBLICATIONS

Dekker et al. Passi4: The next Technology for Passive Integration on Silicon. Electronic Components and Technology Conference, 2007. ECTC '07. Proceedings. 57th; Jun. 2007; p. 968-973.*
Dekker et al. Passi4: The next Technology for Passive Integration on Silicon. Electronic Components and Technology Conference, 2007. ECTC '07. Proceedings 57th; Jun. 2007; pp. 968-973.*

* cited by examiner

*Primary Examiner* — Fernando L Toledo
*Assistant Examiner* — John P Dulka
(74) *Attorney, Agent, or Firm* — Slater & Matsil, L.L.P.

(57) ABSTRACT

A capacitor is described which includes a substrate with a doped area of the substrate forming a first electrode of the capacitor. A plurality of trenches is arranged in the doped area of the substrate, the plurality of trenches forming a second electrode of the capacitor. An electrically insulating layer is arranged between each of the plurality of trenches and the doped area for electrically insulating the trenches from the doped area. The doped area includes first open areas and at least one second open area arranged between neighboring trenches of the plurality of trenches, wherein the at least one open area is arranged below the at least one substrate contact. A shortest first distance between neighboring trenches is separated by the first open areas and is shorter than a shortest second distance between neighboring trenches separated by the at least one second open area.

19 Claims, 36 Drawing Sheets

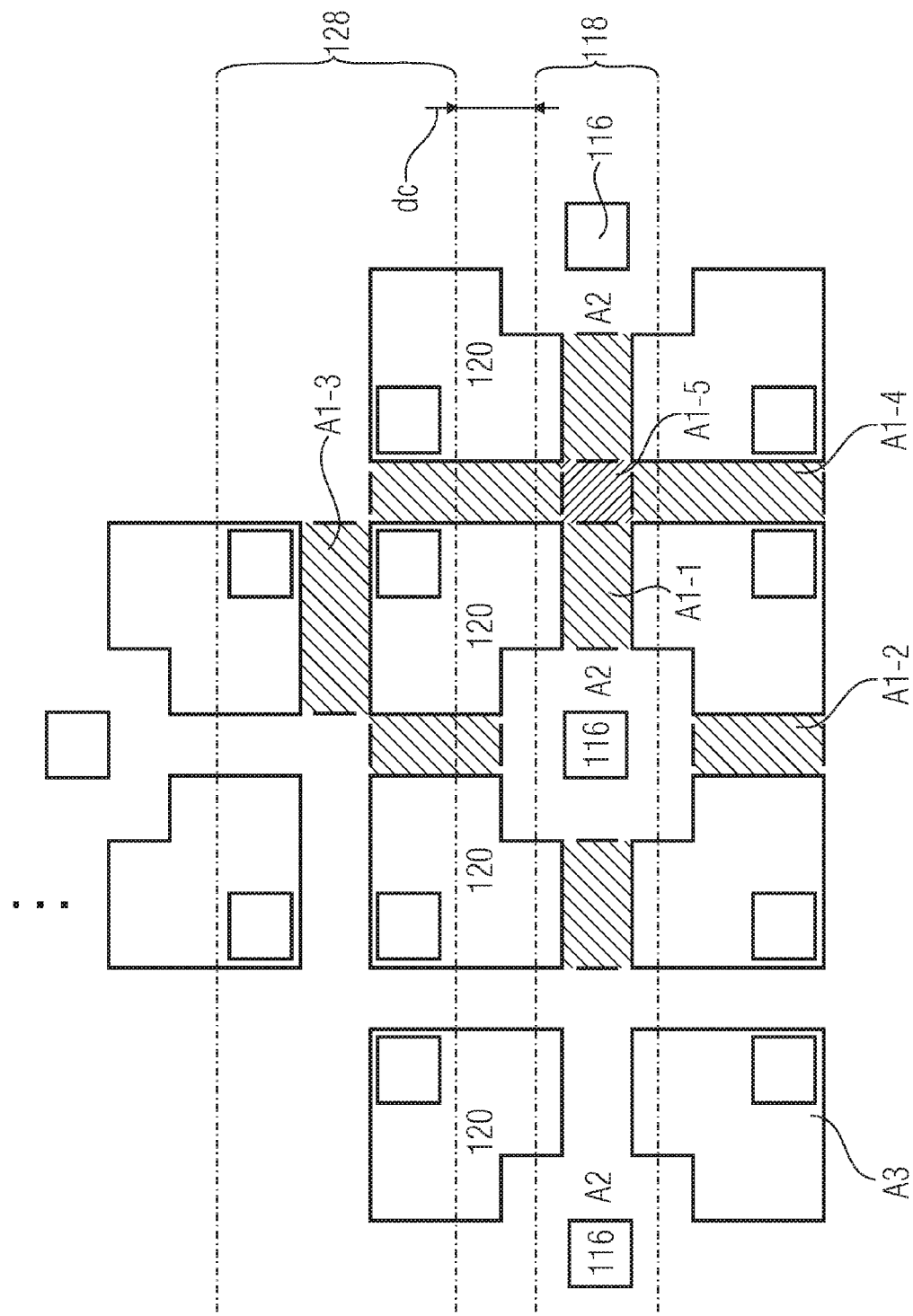

6/1 CELL
double metal

4/3 CELL
single metal

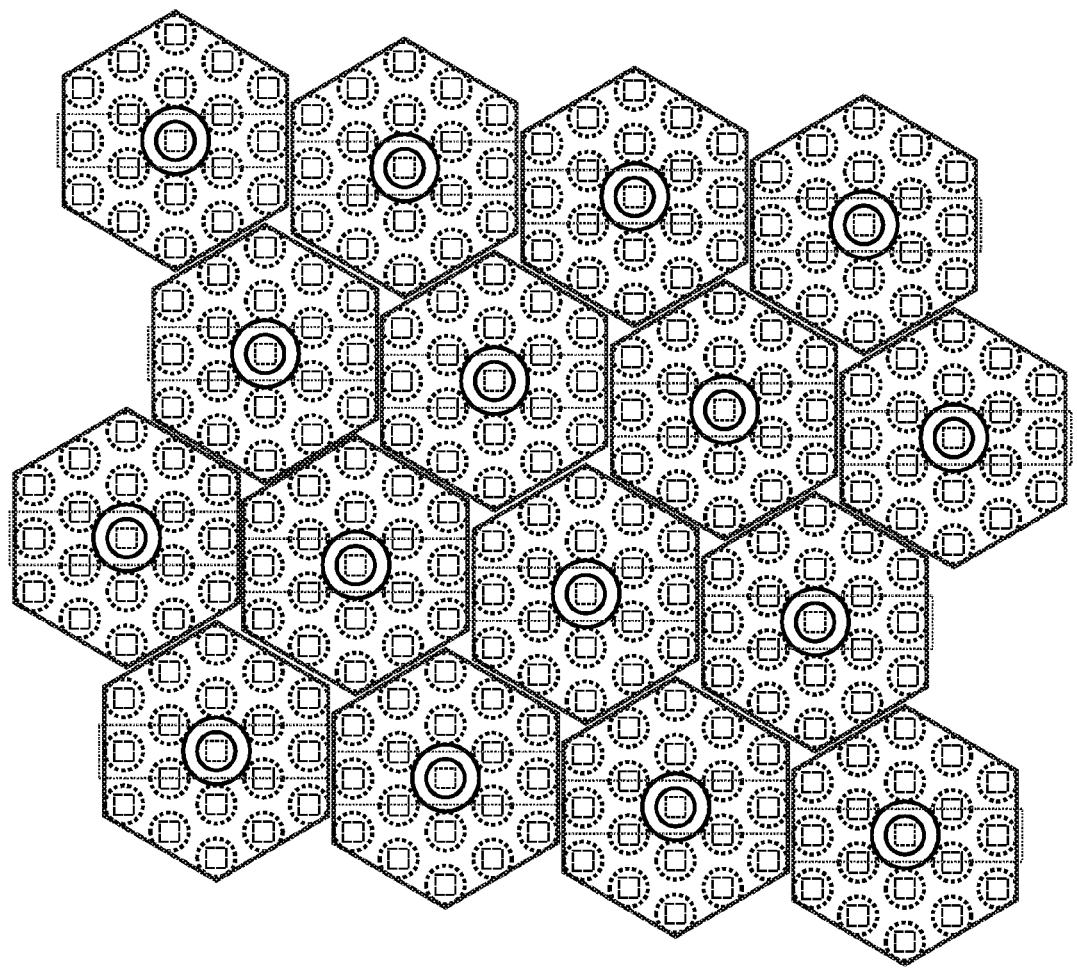
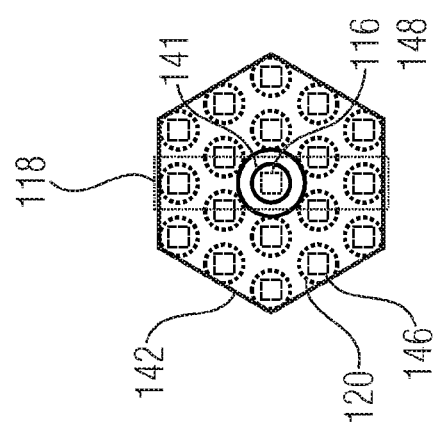
FIG 9
24/1 CELL
double metal single metal type - asymmetric cell

VERTICAL TRENCH CAPACITOR, CHIP COMPRISING THE CAPACITOR, AND METHOD FOR PRODUCING THE CAPACITOR

BACKGROUND

Embodiments of the present invention relates to capacitors and in particular to capacitors integrated in a semiconductor substrate.

Integrated capacitors are important elements in many semiconductor devices or integrated circuits. For example, integrated capacitors are used in PIN switches or filters. Moreover integrated capacitors are used in memory cells in conjunction with a transistor in order to store data information in the memory cells.

One aspect of capacitor design is to further increase the capacity value of capacitors. The capacity of a capacitor is generally expressed as $$C = \in A/T,$$

where $\in$ is the permittivity or dielectric coefficient, A is the area of the capacitor electrode and T is the insulator thickness. Accordingly, possibilities to increase the capacity include increasing the permittivity, e.g., by using high-k materials, reducing the insulator thickness T, and increasing the electrode area A.

However, typically, a second aspect has to be considered in capacitor design: the surface area available for the capacitor structure is limited. In particular in planar integrated circuit design a specific surface area is given for the layout or design of the capacitor, and the task is to provide, for example, a capacitor with maximum capacity using this given surface area of the substrate.

Thus, the task can also be described as increasing or optimizing the "specific capacity", i.e., the capacity per surface area, e.g., measured in $fF/\mu m^2$. The specific capacity is also referred to as "area capacity".

Trench capacitors are one possibility to increase the specific capacity, or in other words, to increase the capacitor area A for a given substrate surface area. These capacitors are produced by creating vertical or almost vertical trenches or trench structures in a semiconductor substrate. The capacitor area A is defined by the "surface area" of the trenches within the substrate. As the capacitor area of these trench capacitors extends into the depth of the substrate it consumes less lateral or surface area of the substrate, and thus, allows to increase the specific capacity.

One possibility to generate capacitors with trench-structures is to etch the substrate such that individual "pillars" of the substrate remain after etching, to dope the substrate including the pillars, deposit a dielectric layer around the substrate pillars and to fill the trench structure around these pillars with a conductive material. The substrate and the pillars form one electrode, whereas the filled continuous trench structure surrounding the pillars forms the second or counter-electrode of the capacitor.

U.S. Pat. No. 7,030,457 B2, describes another conventional trench capacitor structure, where several individual trenches form one electrode of the capacitor, a doped substrate forms a second electrode of the capacitor, and wherein the trenches are electrically insulated from the doped substrate by a dielectric layer. U.S. Pat. No. 7,030,457 B2 uses regular patterns of trenches, where all trenches have the same distance between each other, independent of whether a substrate contact is arranged between these or not. For doping purposes for each substrate contact three trenches are sacrificed, i.e., created but not connected.

SUMMARY OF THE INVENTION

Embodiments of the present invention provide means for increasing the specific capacity of trench capacitors, for flexibly designing trench capacitors for different capacity and/or quality requirements and/or for more efficiently producing the capacitors.

BRIEF DESCRIPTION OF THE DRAWINGS

Embodiments are described herein, making reference to the appended drawings.

FIG. 1H shows a second embodiment for contacting the trench electrodes and the substrate electrodes for an embodiment of the capacitor according to FIG. 1E;

FIG. 9 shows an embodiment of a capacitor based on a layout with a 24/1 cell;

DETAILED DESCRIPTION OF ILLUSTRATIVE EMBODIMENTS

Figure 1A:
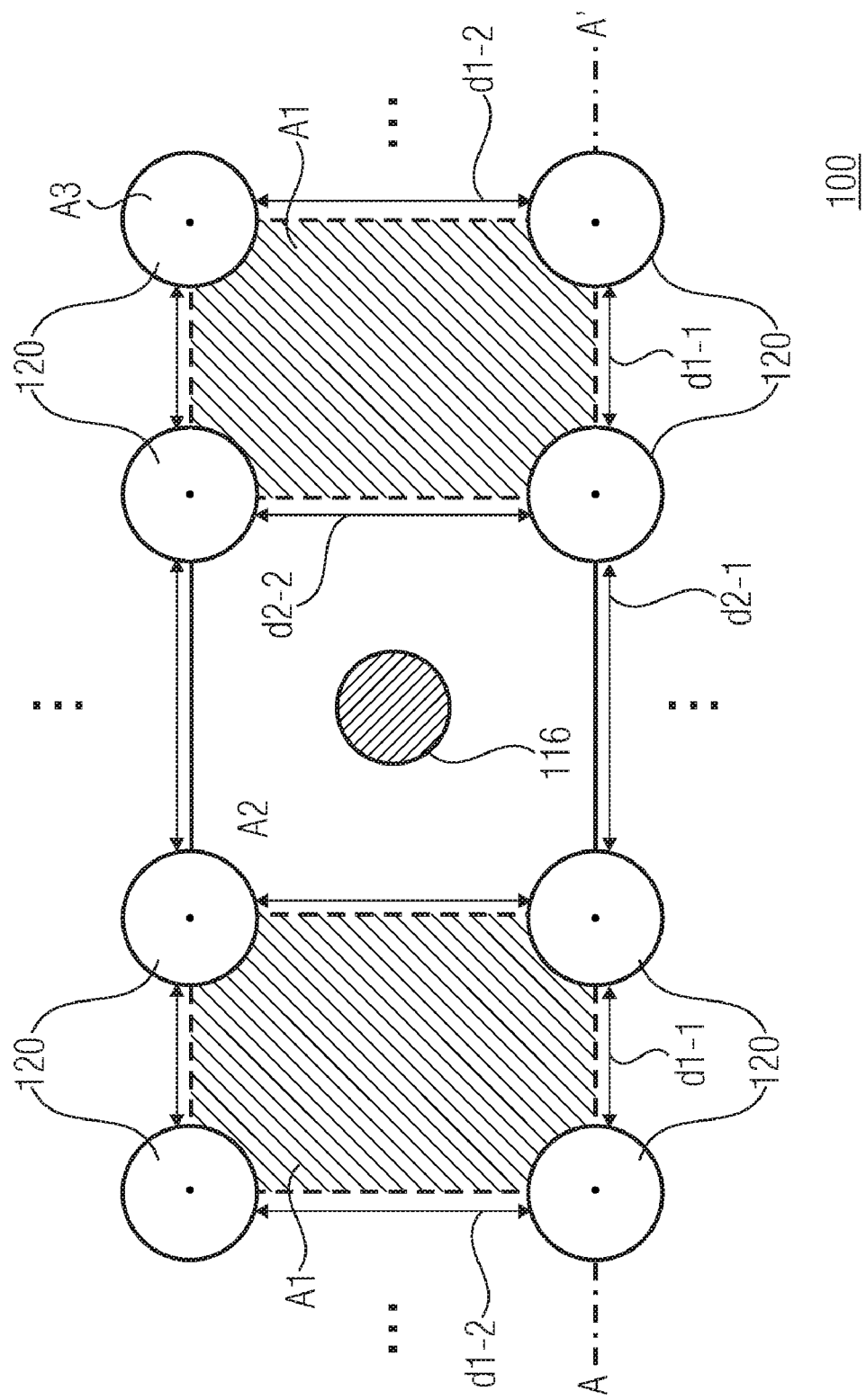
FIG. 1A shows a top view of a first embodiment of a capacitor.

Equal or equivalent elements are denoted in the following description of the figures by equal or equivalent reference numerals.

Figure 1B:
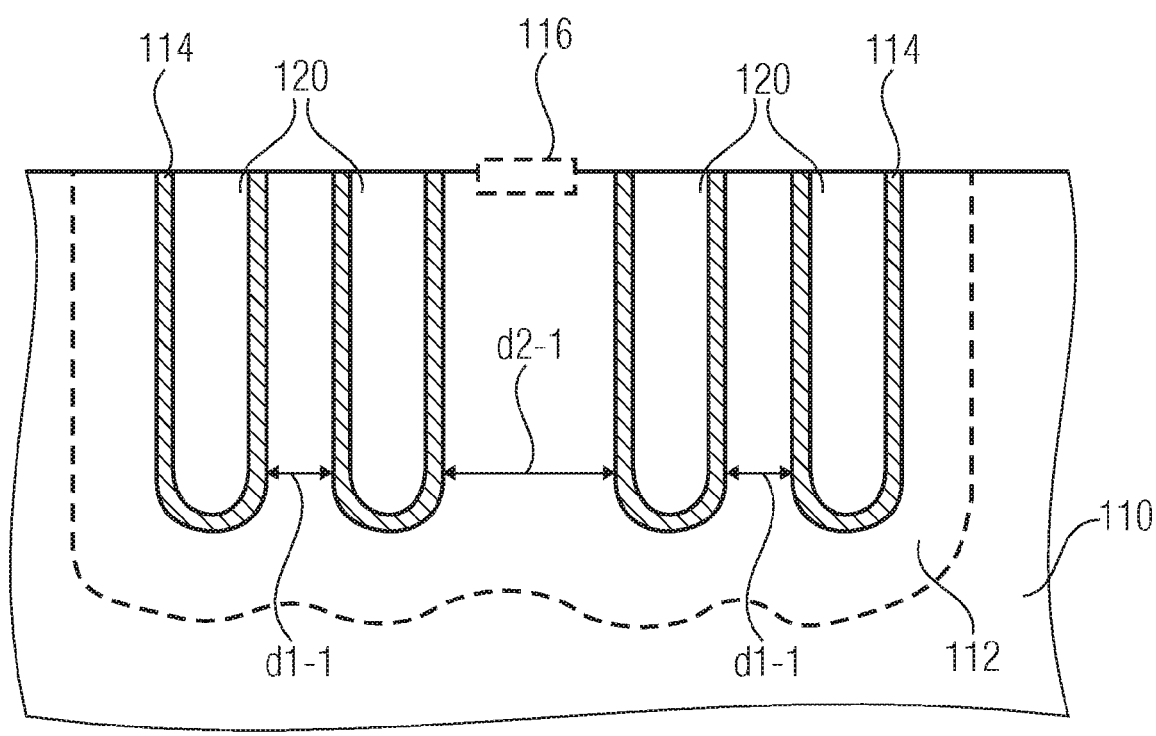
FIG. 1B shows a cross-section A-A' of the first embodiment according to FIG. 1A.

FIG. 1A shows a top-view of a first embodiment of a capacitor 100 and FIG. 1B shows a cross-section A-A' of the embodiment according to FIG. 1A.

FIGS. 1A and 1B show an embodiment of the capacitor 100, comprising a substrate 110 with a doped area 112 of the substrate 110 forming a first electrode of the capacitor 100, a plurality of trenches 120 arranged in the doped area 112 of the substrate 100, the plurality of trenches 120 forming a second or counter electrode of the capacitor 100, an electrically insulating layer or dielectric layer 114 arranged between each of the plurality of trenches for electrically insulating the trenches 120 from the doped area 112 and at least one substrate contact 116 or substrate contact structure 116 for electrically connecting the doped area 112. Although not lying within the cross-section A-A', the substrate contact 116 is shown in FIG. 1B for illustrative purposes using dashed lines.

Doped areas 112 of embodiments of the capacitor comprise a first open area A1 (see hatched areas in FIG. 1A) arranged between neighboring or adjacent trenches 120 of the plurality of trenches and at least one second open area A2, arranged between neighboring or adjacent trenches 120 of the plurality of trenches, wherein the at least one second open area A2 is arranged below the at least one substrate contact 116. The open area of individual trenches 120 is referred to by the reference sign A3.

The term "open area" is used to describe a lateral area or an area of a lateral or horizontal cross section, typically at or near the level of the surface of the substrate 110.

In further embodiments the aforementioned neighboring trenches are defined by surrounding the first or second open area, or vice versa, the aforementioned neighboring trenches form "corners" of the first and second open areas, and thus, define the borderline of the first and second open areas.

In other embodiments points or segments of borderlines of the neighboring trenches form points or respective segments of a borderline of the first and second open areas.

In further embodiments, two trenches are referred to as neighboring trenches if there is no other trench arranged between these two trenches, or if these two or even more trenches are only separated by a first or second open area.

Reference signs d1-1, d1-2 refer to first distances between trenches 120 separated by one of the first open areas A1, and reference signs d2-1, d2-2 refer to second distances between trenches 120 separated by a second open area A2.

Embodiments of the capacitor 100 comprise first open areas A1 and at least one second open area A2, wherein the shortest first distance, e.g., d1-1 in FIG. 1A, of the first distances, e.g., d1-1 and d1-2 in FIG. 1A, is shorter than the shortest second distance (see FIGS. 1A and 1B), e.g., d2-1 in FIG. 1A, of the second distances, e.g., d2-1 and d2-2 in FIG. 1A, between neighboring trenches 120 separated by the at least one second open area A2.

The series resistance of the first electrode formed by the doped area 112 of the substrate 110 can be adjusted by modifying the open area of the substrate contact 116 itself, the area of the open area A2, i.e., by increasing the "conducting cross section area" with regard to the rather "vertical" current flow, and by modifying the first and second distances d1, d2 of the neighboring trenches 120, e.g., by increasing the "conducting cross-section areas" with regard to the rather "lateral" current flow through the clearance of neighboring trenches. A further parameter for adjusting the series resistance of the first electrode is the maximum length or distance between any point of the doped substrate and its nearest substrate contact 116. By reducing this distance the series resistance can also be reduced.

As depicted by the dots in FIG. 1A, the structure shown in FIG. 1A may be repeated in any of the directions to form capacitors with high capacity values.

It should be further noted that the trenches 120 may be arranged in different patterns, typically regular patterns, but also non-regular patterns are possible. For example, the first open area A1 on the left-hand side may defer from the first open area A1 on the right-hand side, and first distances d1-1, d1-2 on the left-hand side may defer from the first distances of the neighboring trenches on the right-hand side of the second cross-section A2.

It should be further noted that the neighboring trenches that are separated by the first cross-section A1 and the second cross-section A2 may be arranged to form, instead of the rectangular open areas A1, A2, any other open area, for example, quadratic, triangular, heptagonal, hexagonal open areas, or any arbitrary open area, where 3, 4, 5, or even more trenches define the corners of the open areas.

Alternatively to the circular open areas of the individual trenches 120, trenches of the embodiments of the capacitor 100 may show any other shape, for example, triangular, rectangular shapes or any other form.

Typical measures for comparing different trench capacitor technologies or trench capacitor structures are, besides the specific capacity, the trench depth, the aspect ratio, the top critical dimension and the bottom critical dimension. The top critical dimension is the minimum lateral dimension at the substrate surface level and the bottom critical dimension is the minimum lateral dimension at the bottom of the trench. The aspect ratio is the ratio between the depth of a trench and the minimum lateral dimensioning of the opening or open area at the surface of the trench, i.e., at substrate surface level.

Conventional trench capacitors used, e.g., for DRAM (Dynamic Random Access Memory) have a medium trench depth but a high aspect ratio.

Other conventional trench capacitor manufacturing processes using, e.g., isotropic ion etching, can achieve, considering circular trenches with a diameter of their open area in the range of 1 µm, a higher trench depth compared to DRAM trenches, resulting in a double digit or even higher aspect ratio.

Embodiments of the capacitor 100 and further capacitors described later are in particular produced, based on deep reactive ion etching, which enables to produce deep trenches with depths of multiples of 10 µm, e.g., deeper than 30 µm. Furthermore, these embodiments provide aspect ratios according to the used option.

Figure 1C:
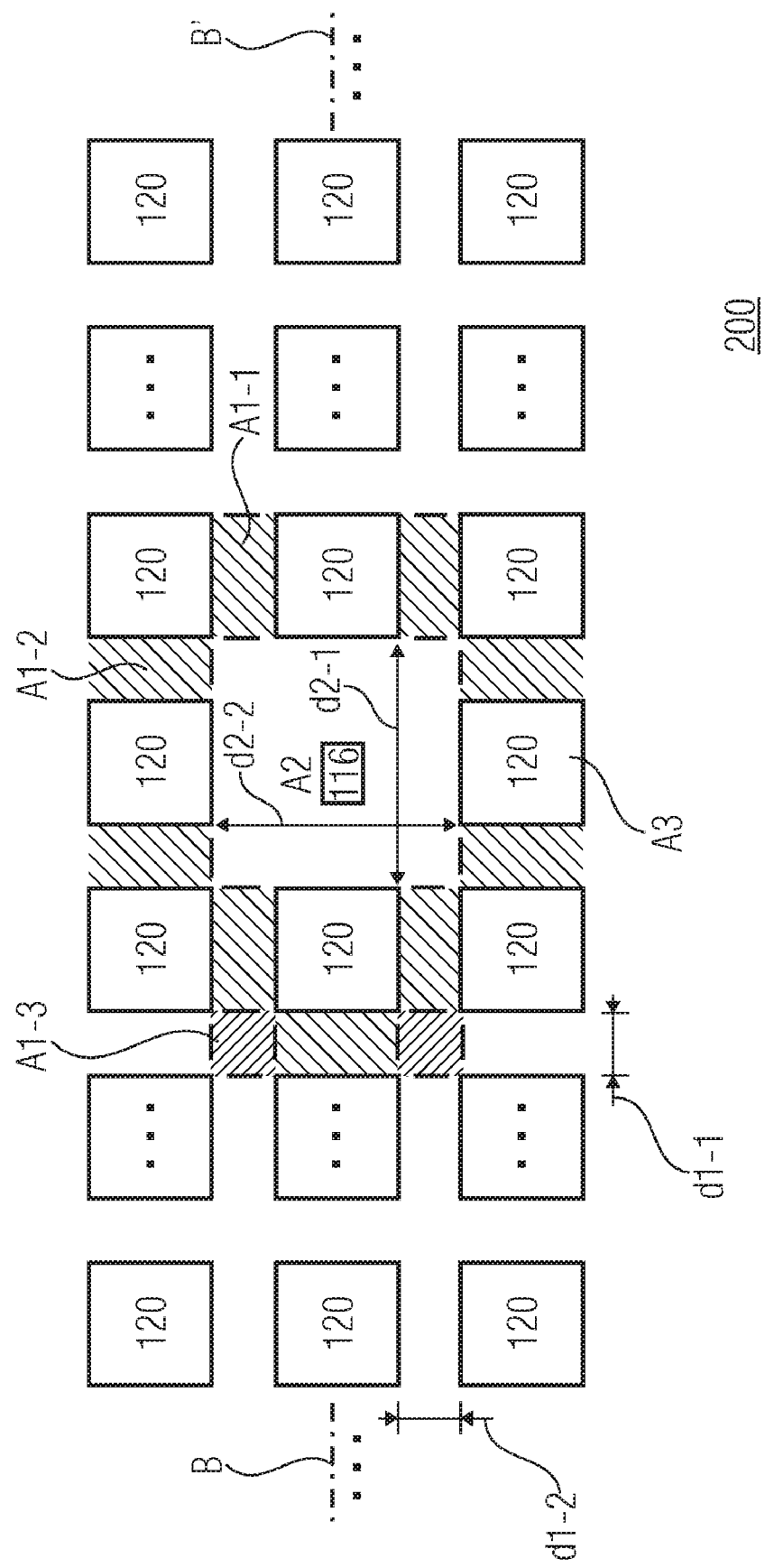
FIG. 1C shows a top view of a second embodiment of a capacitor.
Figure 1D:
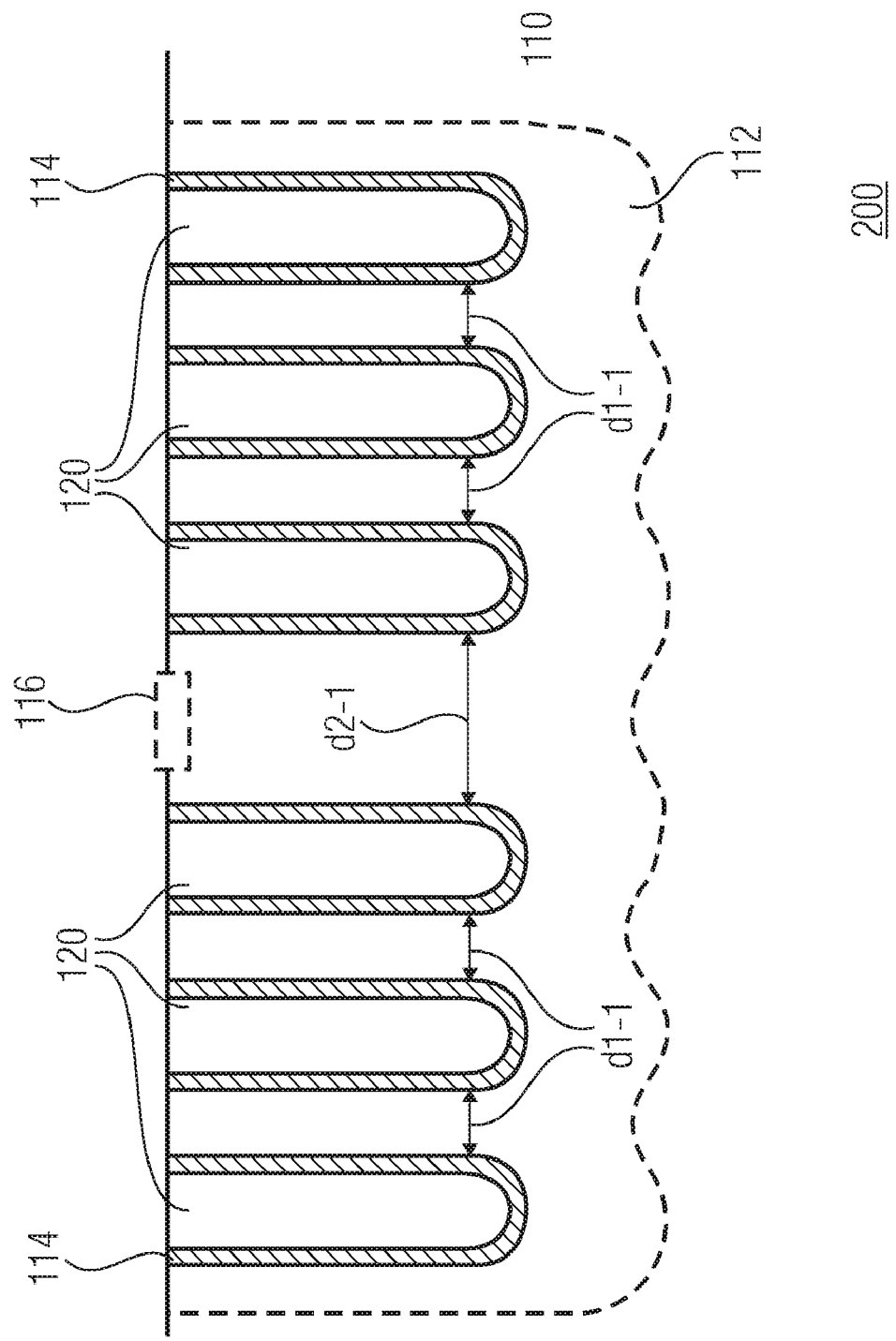
FIG. 1D shows a cross-section of B-B' of the second embodiment according to FIG. 1C.
Figure 1E:
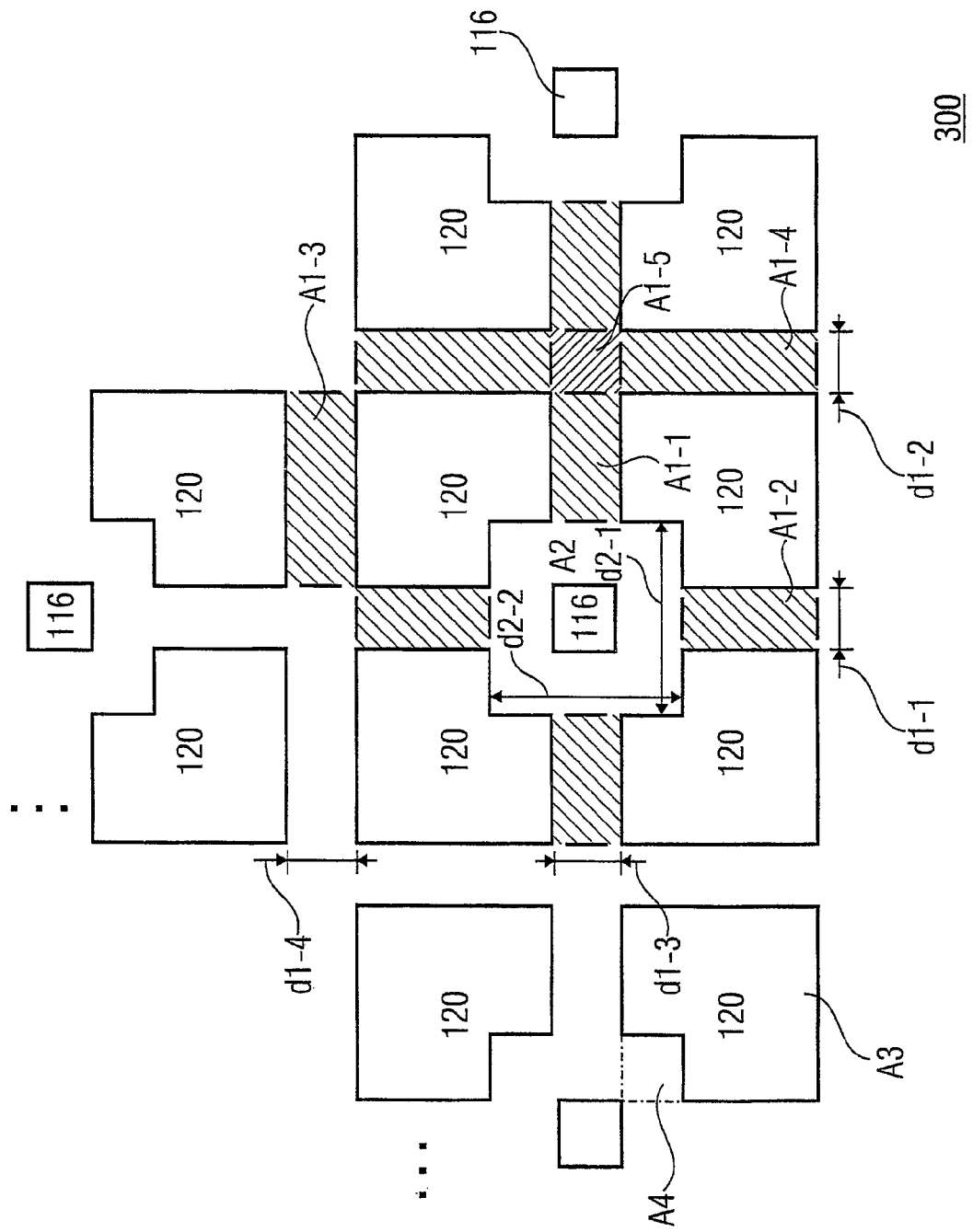
FIG. 1E shows a top view of a third embodiment of a capacitor.
Figure 1F:
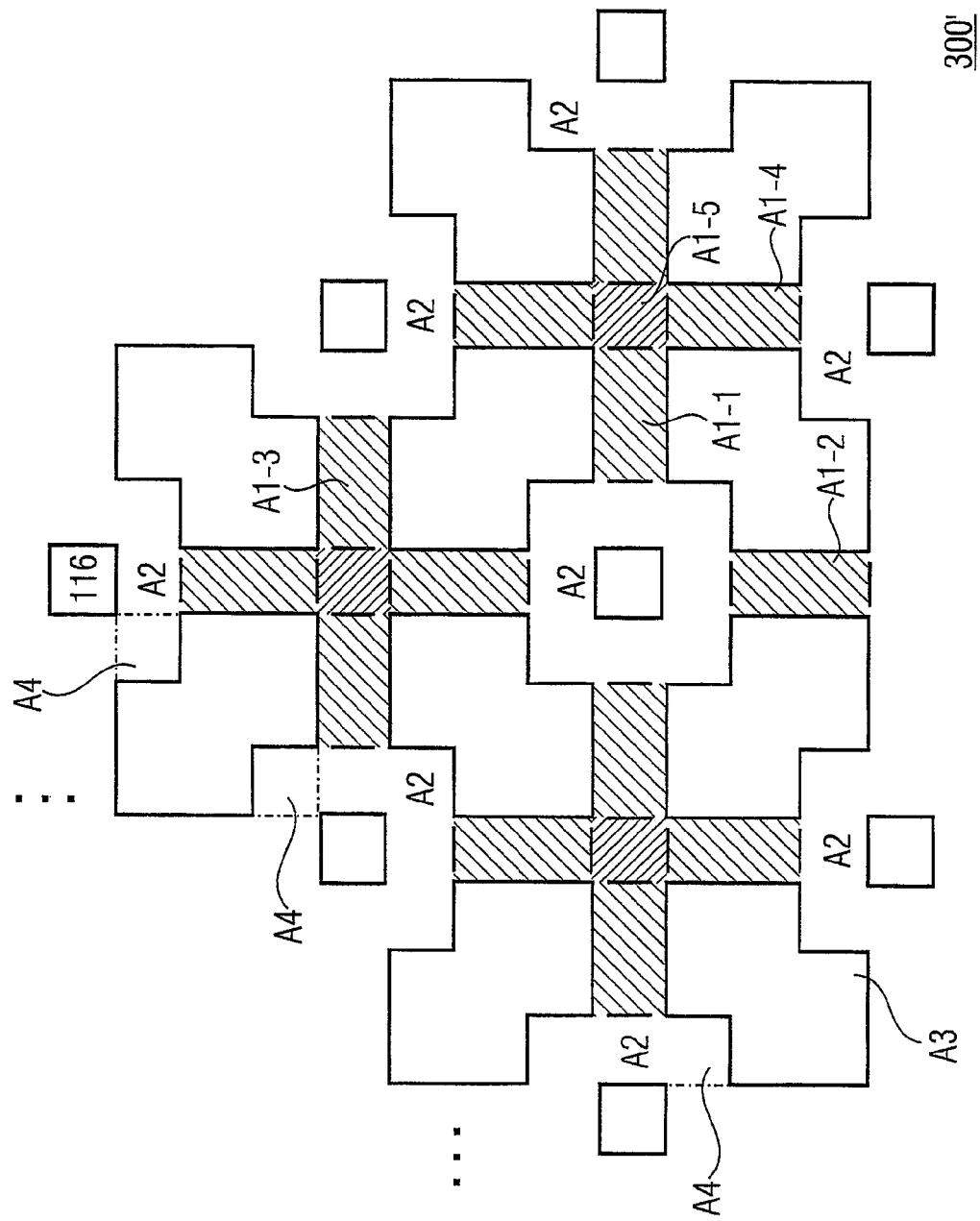
FIG. 1F shows a top view of a fourth embodiment of a capacitor.
Figure 1G:
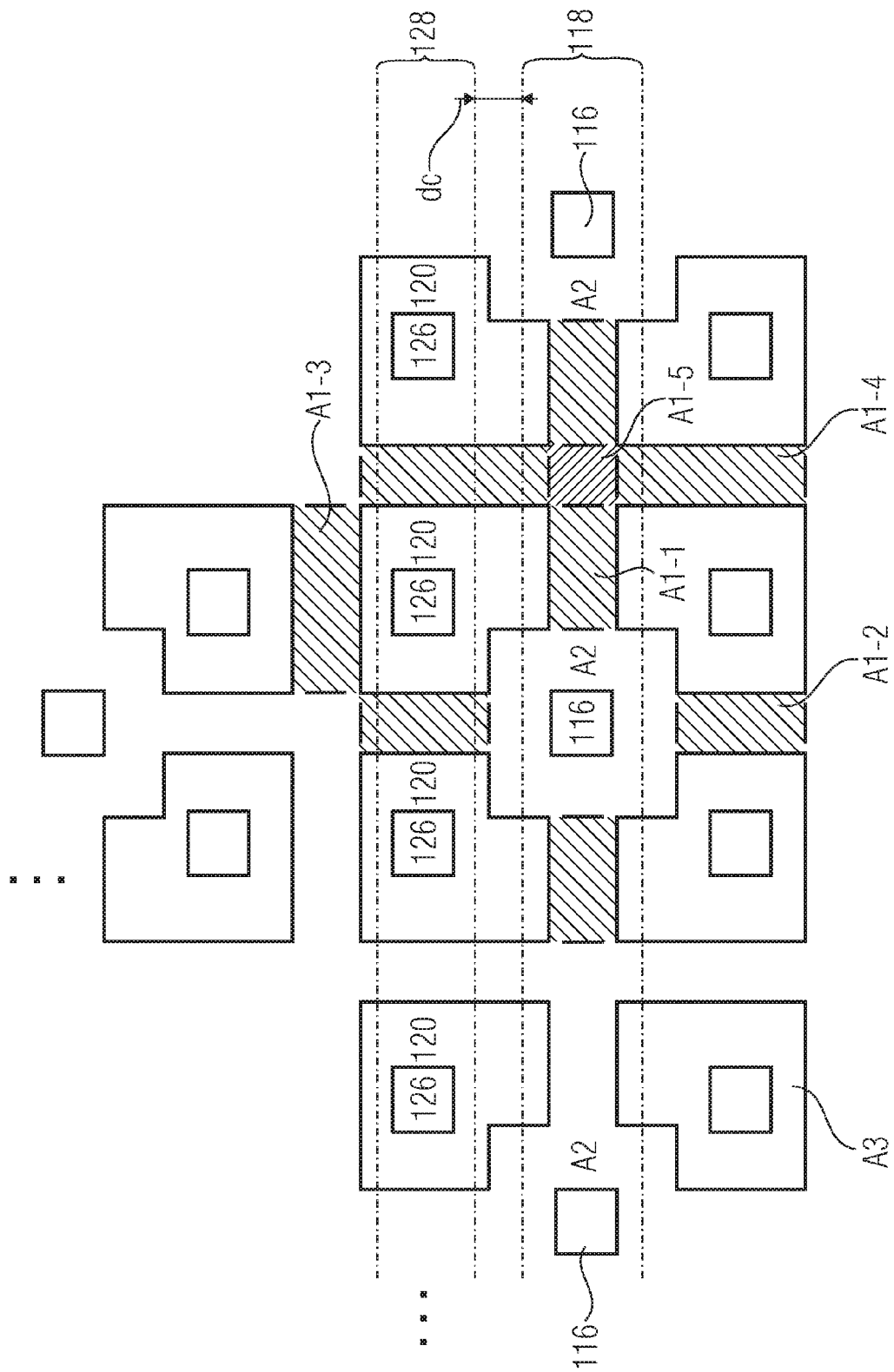
FIG. 1G shows a first embodiment for contacting the trench electrodes and the substrate electrodes of an embodiment according to FIG. 1E.
Figure 1I:
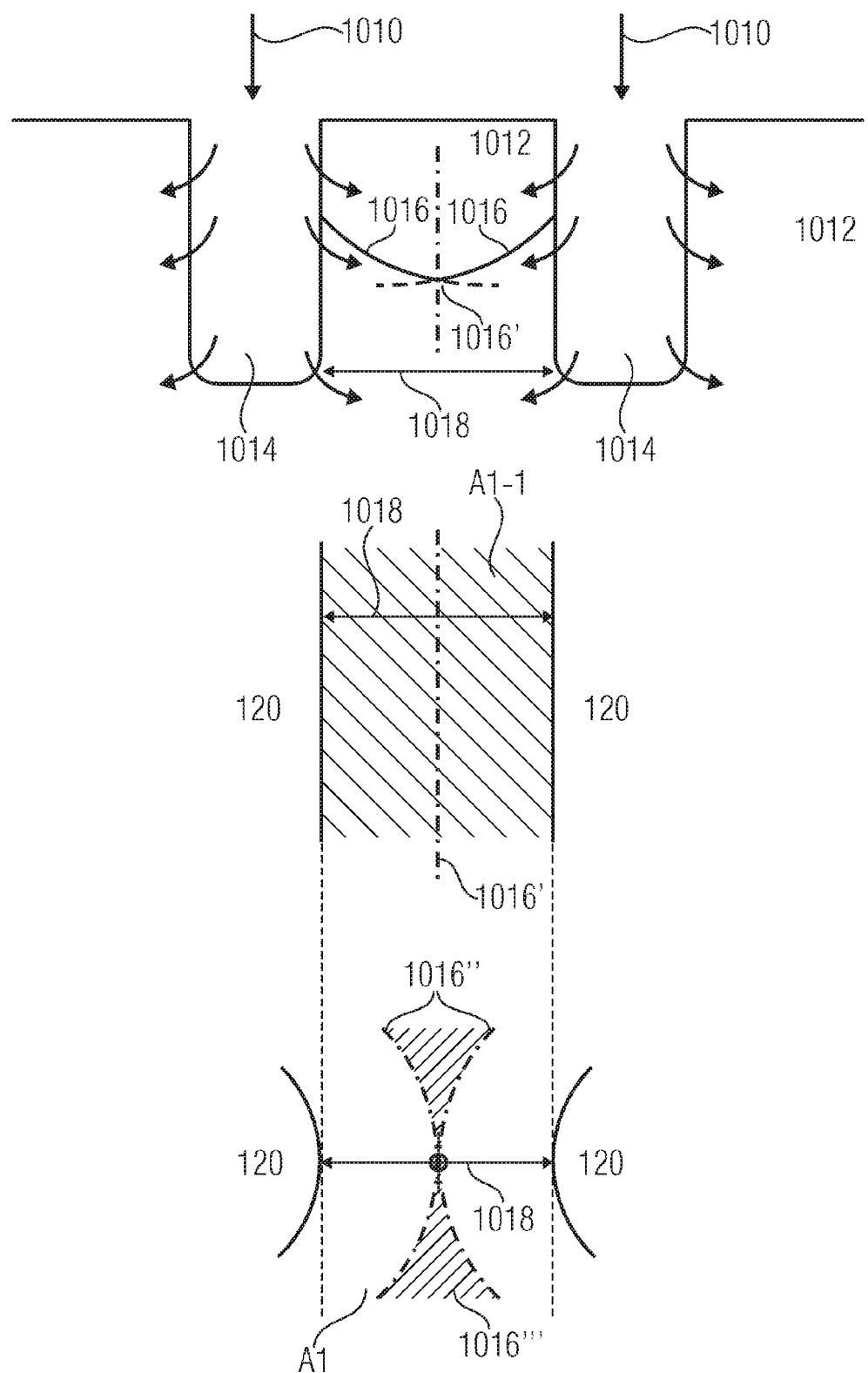
FIG. 1I shows a schematic cross-sectional view of the course of the doping concentration within the substrate.
Figure 1J:
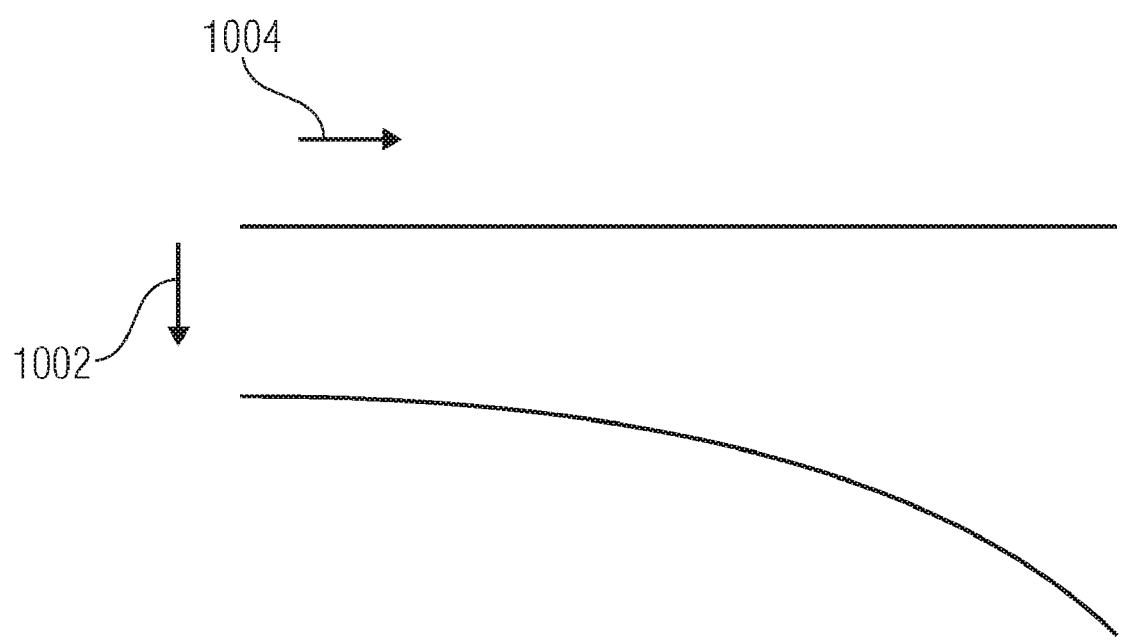
FIG. 1J shows a schematic graph of a possible trench depth in dependence of the trench diameter.

FIG. 1J shows a schematic diagram of an exemplary course of the dependence of the possible depth 1002 from the diameter 1004 of the trench, i.e., the increase of the possible depth with increasing diameter of the trench.

FIG. 1C shows a top-view of a second embodiment of the capacitor 200, and FIG. 1D shows a cross-section B-B' of the embodiment according to FIG. 1C.

FIGS. 1C and 1D show a matrix-like pattern or arrangement of trenches 120, i.e., trenches arranged in columns and lines, where, for example, the forming of one trench has been omitted, for example, by using an appropriate mask during the production process.

The area between the trenches 120 surrounding the "omitted trench" forms the second open area A2, whereas the open areas A1-1, A1-2, A1-3 form first open areas. The second open area is arranged below a substrate contact 116 and electrically connected to the substrate contact 116, for connecting the doped area 112, forming the first electrode of the capacitor 200.

FIG. 1C shows a layout, where the open areas of the trenches 120 have a quadratic shape and where all first distances d1-1 and d1-2 are equal and where all second distances d2-1 and d2-2 are equal.

Similar to embodiments of the capacitor according to FIGS. 1A and 1B, the shortest first distance, for example, d1-1 is shorter than the shortest second distance, for example, d2-1.

In other embodiments of the capacitor 200 shown in FIG. 1C distances d1-1 may be different from d1-2, and d2-1 may be different to d2-2. Furthermore, the open areas of the trenches 120 may be of rectangular, triangle or bubble shape, or may have any other form as will be explained.

Further embodiments of the capacitor 200 may be based on matrices of any number of columns and lines or any other regular patterns of trenches, wherein certain trenches are omitted to electrically connect the doped area of the substrate forming the first electrode via at least one substrate contact and at least one corresponding second open area A2. Further embodiments may comprise any number of substrate contacts 116 and respective second open areas A2.

Embodiments of the capacitor 200 allow for a very dense packaging of the trenches and enable a very high specific capacity, as will be explained in the following.

The square open area of the trenches allows for a more dense packaging of the trenches compared to, e.g., circular trenches, as the absolute area values of the first open areas A1 can be reduced, and also the ratio between the area values of the first open areas A1 and the second open areas A2 and/or the trench open areas can be reduced.

The square open area allows a denser design compared to, e.g., circular trenches. Therefore more deep trenches per surface area are possible.

In addition, the ratio of the perimeter of the open areas of the trenches 120 with regard to the substrate surface can be further increased, compared to trenches with circular open area forms, by using such square open area forms for the trenches.

In the end, all the aforementioned aspects allow to further increase the specific capacity of the capacitor structure.

Furthermore, sufficient doping of the substrate 110 within the first open areas A1 is facilitated, as will be explained based on FIG. 1I.

The upper part of FIG. 1I shows a schematic of the doping 1010 of a substrate 1012 via trenches 1014 (doping into the substrate—see arrows). Reference sign 1016 shows the course of the doping concentration starting from the borderline of the two trenches 1014, which decreases with increasing depth or distance from the borderline of the trench. Reference sign 1016' refers to the minimum doping in the middle between the two trenches. Therefore, a specific doping concentration within the substrate 1012 can be achieved by increasing the doping concentration provided within the doping step, which also increases the cost of production, or by reducing the distance 1018 between two adjacent or neighboring trenches, or by a combination of both. The mid part of FIG. 1I shows a top view of an rectangular second open area, e.g., A1-1 (see hatched area of mid part of FIG. 1I) defined by neighboring trenches 120 with a square open area according to FIG. 1C and the course of the minimum doping 1016' according to the upper part of FIG. 1I. The lower part of FIG. 1I shows, for comparison, the course 1016" of the doping concentration equivalent to the doping 1016' for neighboring trenches 120 with circular open areas and a part 1016''' of the first area A1, which has an even lower doping concentration than 1016' (see hatched area in the lower part of FIG. 1I). It is apparent that by using squared open areas for the trenches 120 a larger share of the second open area A2 is arranged between two straight border lines of opposed neighboring trenches 120, which facilitates sufficient doping of the doped area and thus, enables to reduce the series resistance of the doped area 112.

Although FIG. 1C shows an embodiment with trenches having square open areas, similar effects of increased capacity and reduced series resistance can also be achieved by using other compact forms for the open areas of the trenches, e.g., rectangular, triangle, cigar or bubble forms or others. Some of these alternative forms and their effects will be discussed later in more detail.

Beyond the aforementioned effects, embodiments of the capacitor 200 can be easily designed to fulfill specific high capacity requirements by selecting the number of trenches 120 to be omitted, or in other words, to be replaced by substrate contacts 116, as shown in FIG. 1C. The lower the number of "omitted trenches" or substrate contacts the more trenches add to the overall capacity of the capacitor 200. For maximum capacity designs only one substrate contact is used for 50, 100, or even more than 200 trenches. The positions of the substrate contacts are selected such that the maximum distance between a trench 120 and the next substrate contact 116 is minimized.

In general, embodiments of the capacitor 200 comprise a trench raster with raster points, wherein the trenches are arranged on the raster positions defined by the trench raster, and wherein at least one second open area or substrate contact is arranged on a position of the trench raster instead of a trench. In further embodiments, center points of open areas of the trenches and a center point of the at least one second open area are arranged at the positions of the trench raster.

The trench raster can be a matrix with rows or columns. In another embodiment the trench raster can comprise parallel rows or columns, where the neighboring columns or rows are shifted with regard to each other, as, for example, used for circular trenches. Other regular rasters are also possible.

By increasing the number of substrate contacts 116 per given number of trenches 120, the capacity is reduced, however the series resistance is decreased and thus, the quality of the capacitor increased.

Therefore, based on the aforementioned concept, embodiments of capacitors 200 fulfilling different requirements with regard to capacity and/or quality can be easily and flexibly designed and produced.

FIG. 1E shows a third embodiment 300 of the capacitor comprising a matrix of columns and lines of trenches 120 or 120 in an "L-shape". The open area of the trenches can be described as square, where smaller squares have been cut out at one corner of the larger squares. The trenches 120 and respectively the gaps or omissions in the form of smaller squares are arranged such that the latter provide a large second open area A2, wherein the shortest first distance, one of d1-1 to d1-5, is shorter than the shortest second distance, for example, d2-1, of the second open area A2.

Embodiments of the capacitor 300 combine the effect of high packaging ratios of trenches with the effect of trenches having large open area perimeters and accordingly large trench surface areas. Thus large specific capacities are possible.

In embodiments according to FIG. 1E, the square trenches 120 comprise a square omission and have the same perimeter as the "original squares" (see, e.g., FIG. 1C) without omission.

Although FIG. 1E shows square trenches with square omissions, alternative embodiments may comprise square trenches with rectangular omissions or omissions of another shape, or comprise trenches 120 of another shape, for example, rectangles, circles, etc., with square rectangular omissions, or omissions in any other form to achieve the same or similar advantages as described based on FIG. 1E.

Generally speaking, embodiments of the capacitor 300 comprise a plurality of trenches, wherein at least two trenches 120 of the plurality of trenches comprise an open area A3, wherein a part A4 of the open area A3 is cut out (see dot and dash line, also later in FIG. 2I), and wherein the at least two trenches are arranged such that the cut out parts A4 are directed towards each other and form a part of said at least one second open area A2.

Further embodiments comprise trenches 120 with an open area having a basic geometric shape, e.g., a circle, a triangle, a rectangle, a square, a heptagon, or a hexagon, and wherein the parts A4 are cut out of these basic geometric shapes.

FIG. 1F shows a fourth embodiment of a capacitor 300' with trenches 120, which is similar to the embodiment of the capacitor 300 according to FIG. 1E. Trenches 120 comprise open areas with two omissions on opposite sides, wherein the trenches 120 and the respective omissions are arranged such that the omissions form second open areas A2.

Although embodiments of the capacitor 300 show trenches with one omission, embodiments of the capacitor 300' according to FIG. 1F show trenches with two omissions, and alternative embodiments of the capacitor may comprise three or more omissions at various positions to achieve the same or similar effects as described based on FIGS. 1A and 1F.

For purposes of clarity and readability of the figures, only some first and second distances and only some first and second open areas have been assigned reference numbers and have been hatched.

FIGS. 1G and 1H show embodiments of the capacitor 300, comprising additionally trench contacts 126 or trench contact structures 126 for electrically connecting the trenches 120.

In FIG. 1G the trench contact structures 126 are arranged in the midpoint or center of the individual trenches 120. The trenches 120 are contacted via the trench contact structures 126 to a second conductor structure 128, for example, a lateral second conductor structure 128. The doped area 112 of the substrate 100 is connected via the substrate contacts 116 or substrate contact structures 116 to at least one first conductor structure 118, for example, a lateral first conductor structure 118.

The first conductor structure 118 and the second conductor structure 128 can be, for example, as shown in FIG. 1F arranged in parallel and the same layer of the capacitor. In further embodiments, the first conductor structure and the second conductor structure 128 may be in different layers of the capacitor, and may be, for example, arranged parallel or orthogonal to each other, or in any other direction to each other.

The conductor structures 118, 128 have a large influence on the design, and the possible packaging density as minimum distances between the two conductor structures have to be regarded, in particular when both conductor structures 118, 128 are arranged in the same layer and parallel to each other. FIG. 1G shows the distance dc between the two conductor structures 118 and 128.

FIG. 1H shows an embodiment of the capacitor 300 comprising trench contact structures 116 moved from the center of the open area of the trench 120 towards the borderline of the open area of the trench 120. This "moved" position can also be referred to as asymmetric or excentric position of the trench contact structure 116 and allows to reduce the distances between the trenches, or in other words to increase the packaging density of the trenches 120, while still maintaining a sufficient distance dc (see FIG. 1H) between the first conductor structure 118 and the second conductor structure 128. Furthermore, as can be seen from FIG. 1H, two adjacent or neighboring lines of trenches 120 can be connected by one conductor structure 128, which is only slightly wider than the second conductor structure 128 shown in FIG. 1G for one line of trenches. Thus, additionally to the increase in packaging density, production material can be reduced.

Figure 1K:
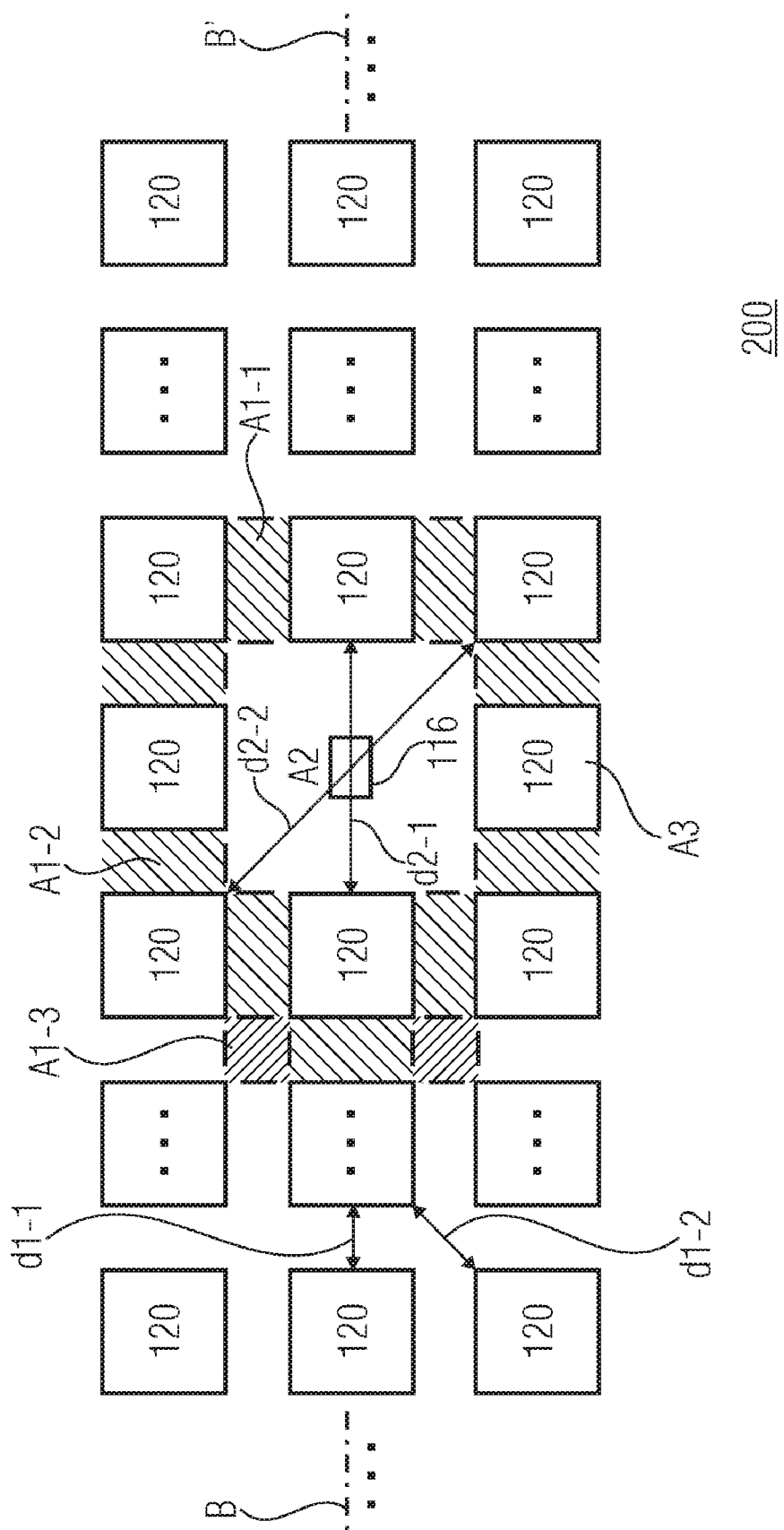
FIG. 1K shows an embodiment according to FIG. 1C with short distances through center points.

In further embodiments the shortest second distance is a shortest distance between the neighboring trenches of the plurality of trenches separated by the at least one second open area through a straight line through a center point of the substrate contact, and the shortest first distance is a shortest distance between the neighboring trenches of the plurality of trenches separated by a first open area through a straight line through a center point of the first open area, as will be explained based on FIG. 1K.

FIG. 1K corresponds to FIG. 1C and additionally show the first distances d1-1, d1-2 through a center point of the first open areas and the second distances d2-1, d2-2 through a center point of the substrate contact 116, the first distance d1-1 being the shortest first distance, the second distance d2-1 being the shortest second distance.

In further embodiments the shortest second distance is the shortest distance between the neighboring trenches of the plurality of trenches separated by the at least one second cross-section through a center point of the second open area, and the shortest first distance is a shortest distance between the neighboring trenches of the plurality of trenches separated by a first open area through a straight line through a center point of the first open area.

For embodiments according to FIG. 1C, the first and second distances correspond to the ones shown in FIG. 1K, as the center point of the substrate contact corresponds to the center point of the second open area. However, e.g., in embodiment with excentric substrate contacts, these distances do not coincide.

In further embodiments the minimum distance between opposite sides of the second open area A2 is larger than a minimum distance between opposite sides of first open areas A1.

In further embodiments of the capacitor, an area of the second open area A2 is larger than an area of the first open areas A1.

In the following different connecting structures for connecting the first electrode, i.e., the trenches, which is also referred to as a trench electrode or a top electrode, and the second electrode, i.e., the doped area of the substrate, which is also referred to as a substrate electrode or a bottom electrode, are described.

Figure 2A:
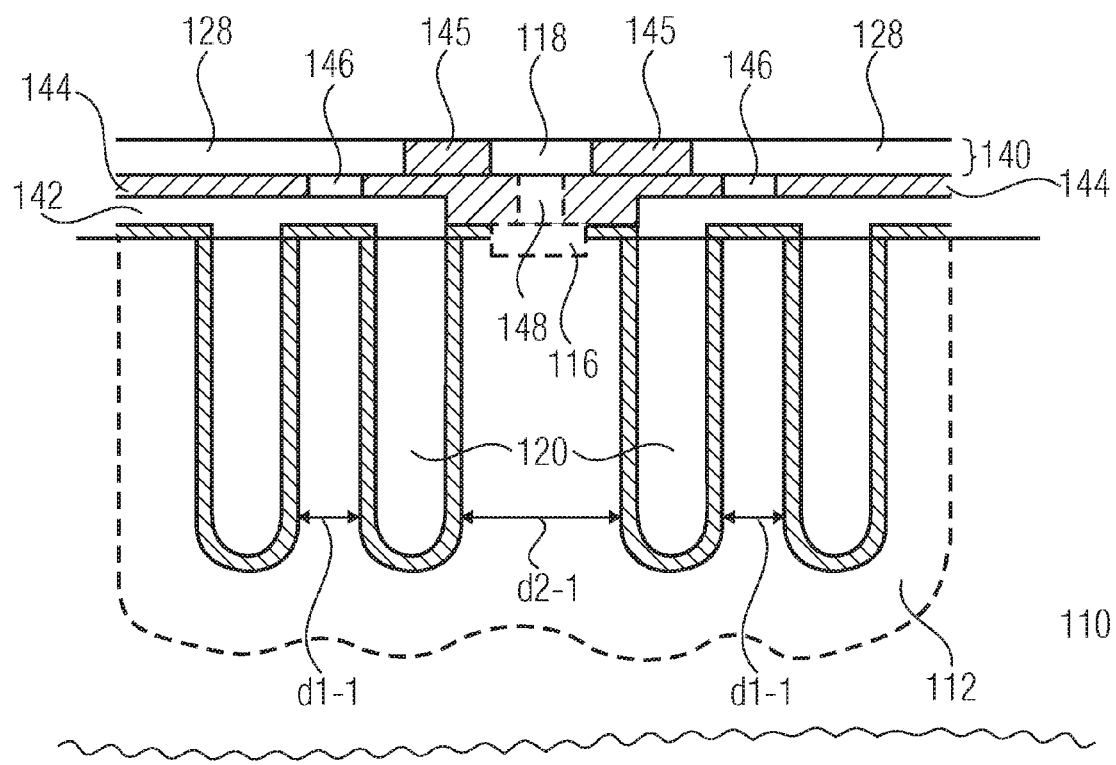
FIG. 2A shows a first connecting structure for connecting a capacitor via a single conductive layer.

FIG. 2A shows a first connecting structure for connecting a capacitor 100, 200, 300 via a single conductive layer, e.g., a single metallization layer.

As shown in FIG. 2A, the trenches 120 are electrically connected via a conductive plate 142 with each other, which can be, for example, produced within the same step as the filling of the trenches by extending the filling to create the conductive plate 142. Accordingly, the conductive plate 142 may comprise the same material as the filling material, for example, poly-crystalline silicon. In other embodiments, the conductive plate 142 can be produced in a separate step and/or using different material, being different from the filling material used for filling the trenches 120.

The conductive plate 142 is connected to a second conductor structure 128 arranged in the conductive layer 140.

The conductive plate 142 and the second conductive structure 128 are separated and electrically insulated by an insulating layer 144, for example, comprising $SiO_2$ and are electrically connected with each other via a contact hole 146 filled with an electrically conductive material.

A substrate contact structure 116 is connected to a first conductor structure 118 arranged in the conductive layer 140. The substrate structure 116 and the first conductor structure 118 are separated and electrically insulated by the insulating layer 144 and connected via a second contact hole 148 arranged within the insulating layer 144 and filled with a conductive material.

In typical embodiments, the first conductor structure 118 and the second conductor structure 128 are arranged in parallel for easier design and production, but may also be arranged in different layouts.

The first and second conductor structures 118, 128 can be used, for example, to connect the capacitor 100, 200, 300 with other circuit elements integrated into the same substrate 110.

Figure 2B:
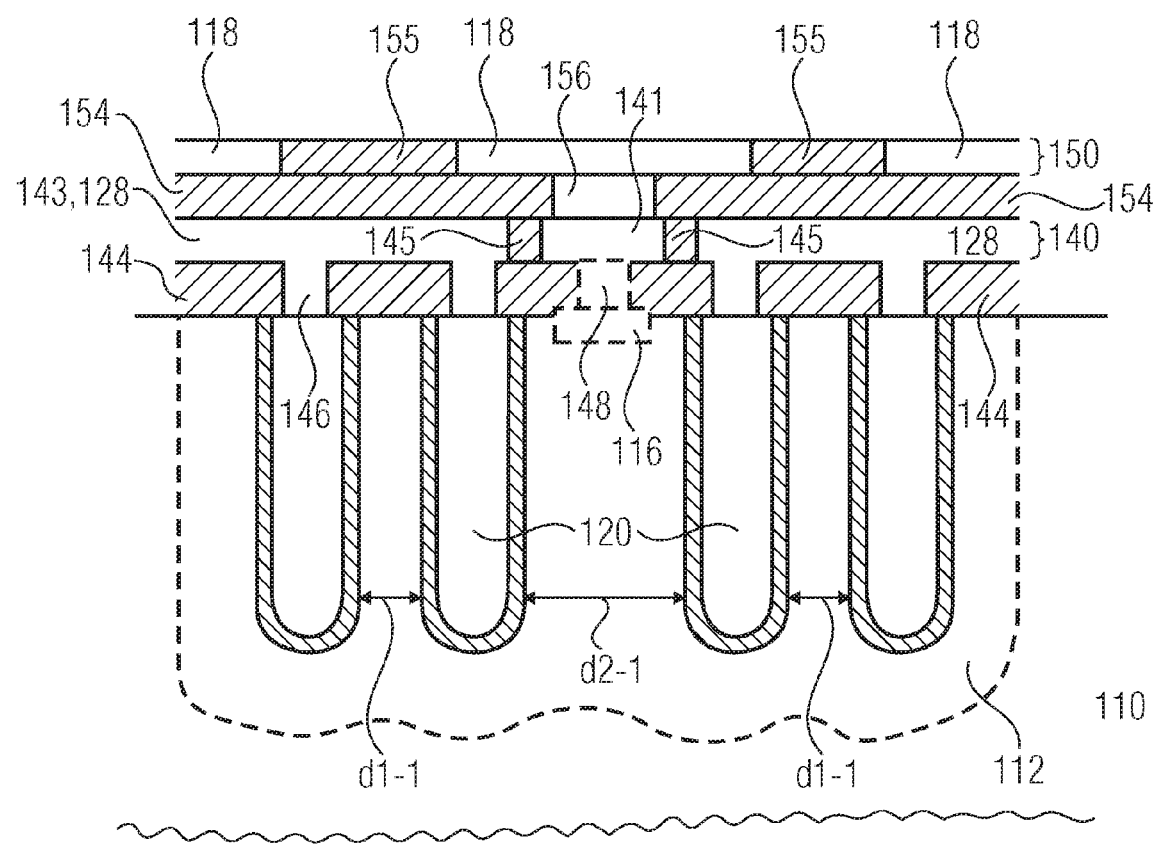
FIG. 2B shows a second connecting structure for connecting a capacitor via two conductive layers.

FIG. 2B shows a second embodiment of a connecting structure for connecting the capacitor 100, 200, 300 comprising a double conducting layer structure with a first conducting layer 140 and a second conducting layer 150.

On top of the substrate a first insulating layer 144 is arranged and on top of the first insulating layer the first conductive layer 140. The second conductive layer 150 is arranged on top of the first conducting layer 140, wherein both conductive layers 140, 150 are separated and electrically insulated by a second insulating layer 154.

A substrate contact structure 116 is connected to a first conductive layer part 141 of the first conductive layer 140 via the second contact hole 148 arranged within the first insulating layer 144 and filled with a conductive material. The first conductive layer structure 141 is connected to the first conductor structure 118 arranged in the second conductive layer 150 through a conductive via 156 arranged in the second insulating layer 154.

The trenches 120 are connected via first contact holes 146 with the second conductive structure 128 arranged in the first conductive layer 140, the first contact holes 146 being arranged in the first insulating layer 144 and filled with a conductive material.

The filled contact holes 146 form, e.g., plugs 146, each connecting individual trenches 120 with the second conductor structure 128. Therefore, they also represent contacts of the trenches.

The first conductive layer part 141 and the second conductor structure 128, which can also be referred to as second conductive layer structure 143 of the first conductive layer, are separated, and electrically insulated by a first insulating structure 145. The first conductor structure 118 within the second conductive layer 150 is electrically separated from other first conductor structure 118 and/or other possible conductor structures arranged in the same second conductive layer 150 by second insulating structures 155.

FIG. 2A and FIG. 2B show two embodiments of connecting structures for connecting embodiments of the capacitors 100, 200, 300. However, it is apparent to a person skilled in the art that other connecting structures can also be used to achieve the same merits. In particular, conductive plates 142 according to FIG. 2A can also be used in two conductive layer structures as described based on FIG. 2B, and individual trench contacts or plugs 146 for connecting individual trenches as described based on FIG. 2B can also be used in single conductive layer structures as described based on FIG. 2A.

In particular, a conducting plate 142 as shown in FIG. 2A can also be used in two conductive layer structures, as described based on FIG. 2B, to connect the plurality of trenches 120 with each other. On the other hand, the trenches of the plurality of trenches 120 can be individually connected to the second conductor structure 128 arranged in a single conducting layer structure, as described based on FIG. 2A.

Furthermore, in further embodiments, the conductive plate 142 according to FIG. 2A may already form the second conductor structure 128. In this case, no contact holes 146 would be necessary to connect the conductive plate 142 to a separate conductive structure in a different layer.

The conductive layers 140 and 150 can be implemented and/or also referred to as metallization or metallization layers. Accordingly embodiments with a single conductive layer can also be referred to as single metallization or single metal, and embodiments with two conductive layers also as two layer metallization or double metal.

In the following, further embodiments of the capacitor will be described, wherein the term "cell" refers to a basic building block or a smallest entity of the layout which is repeatedly used to create the capacitor. The embodiments of the deep-trench cells shown in the following shall be referred to by their characteristic term based on the trench distribution between the number of trenches 120 and the corresponding number of substrate contacts 116 per cell. Specific cells obtain an arbitrary term.

If not otherwise stated the following figures show top-views of embodiment of the capacitors 100, 200, with the following order of elements or layers from top to bottom: parts of the second conductive layer 150, the vias 156, parts of the first conductive layer 140, the filled contact holes 146, 148 and the trenches 120 (as described based on FIGS. 2A and 2B).

Furthermore, if not otherwise stated, the trenches 120 are depicted using dotted lines with thick dots, parts of the first metal or first conductive layer 140 are depicted using continuous thick lines, parts of the second metal or second conductive layer 150 are depicted using dotted lines with thin dots, the filled contact holes 146, 148 within the first insulating layer 144 are depicted using thick dashed lines, and the vias 156 within the second insulating layer 154 are depicted using thin dashed lines.

For each of the following embodiments of the cells, an embodiment of a layout is enclosed. However, these specific embodiments have no limiting meaning, as it is obvious for a person skilled in the art that based on the description other layouts and dimensions are possible to achieve the effects as discussed herein.

Figure 3:
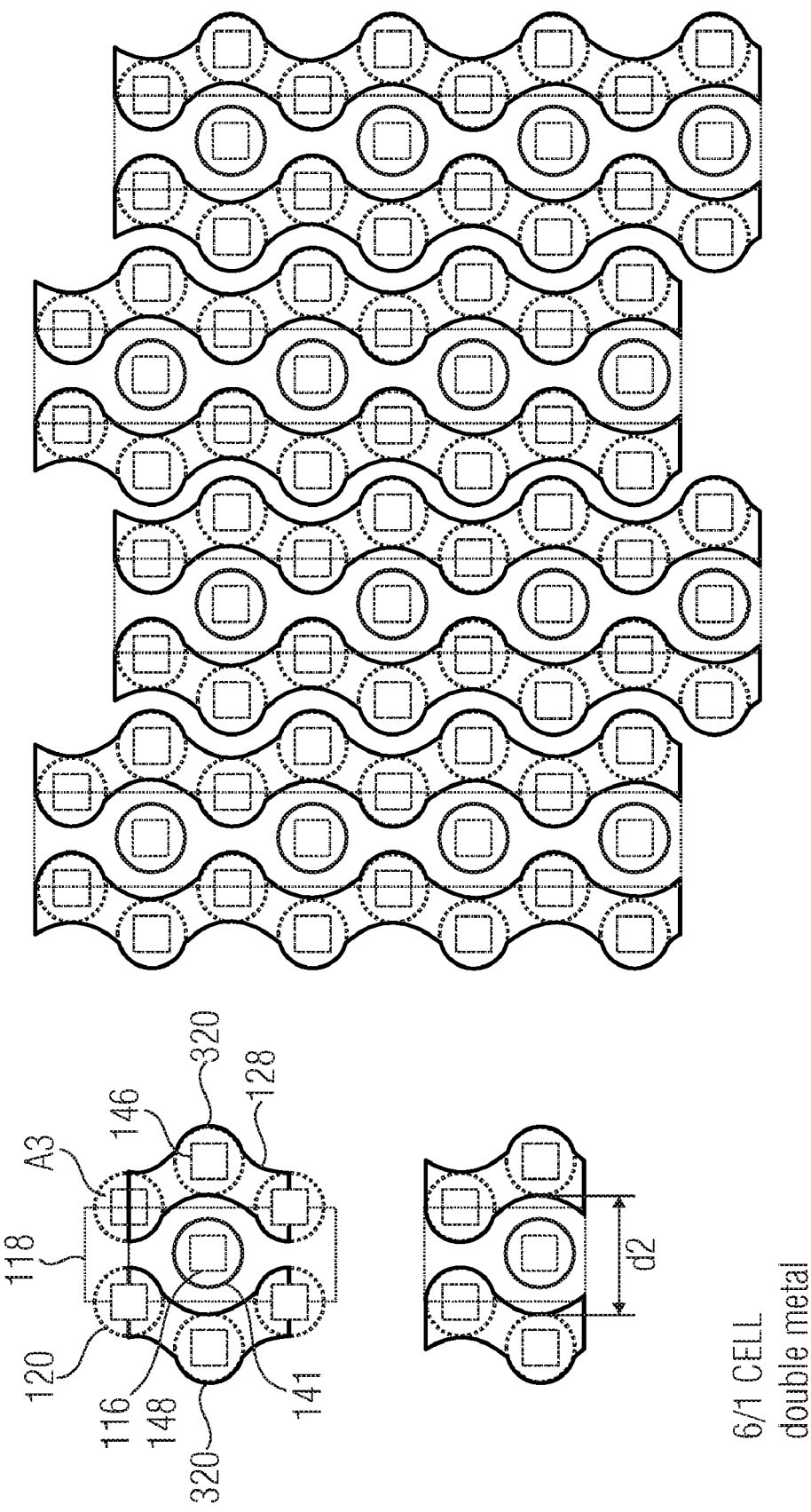
FIG. 3 shows an embodiment of a trench capacitor layout based on a 6/1 cell.

FIG. 3 shows an embodiment of a trench capacitor layout based on a 6/1 cell, each cell comprising one substrate contact 116 for six trenches 120 with a circular open area. FIG. 3 shows on the left top side the basic layout of the 6/1 cell comprising the six trenches 120, arranged around one substrate contact structure 116.

FIG. 3 shows an embodiment of the capacitor with two connection layers or conductive layers (double metal).

As can be seen from the right-hand side of FIG. 3 showing a part of a capacitor, the layout of the capacitor has been derived from parallel columns or rows of trenches, where the neighboring columns or rows are shifted with regard to each other, to allow for a higher packaging density of the trenches.

In further embodiments of the capacitors based on the 6/1 cell as shown in FIG. 3, the distance d2 between the two trenches 320 on opposite sides of the open area A2 can be further reduced, to allow for an even higher packaging of trenches.

The trenches 120 can be connected to each other via a conductive plate, as shown in FIG. 2A, or individually to the second conductive structure 128 (as shown in FIG. 3 and 2B).

Embodiments of a capacitor using a 6/1 cell can also comprise a single metallization, however, in this case the distance between the first and second conductive structure 118, 128 would limit the packaging density due to the minimum distances, which are required between the first and the second conductor structure 118, 128. The two-layer metallization as shown in FIG. 3 allows for the designing of layouts with minimum dimensions and distances, and thus, maximum packaging density.

FIG. 3 shows a layout, where the trenches or cells have been arranged in parallel columns and rows which are shifted with regard to their neighbors columns or rows of trenches, thus forming wavy columns connected to each other by wavy second conductor structures 128. The shifted arrangement allows a denser packaging compared to columns and rows of circular trenches arranged in a matrix without shifts.

In the embodiment according to FIG. 3, the substrate contacts 116 are also arranged in columns or rows, which are shifted with regard to the next column or row of substrate contacts 116. FIG. 3 in particular shows an embodiment where two columns of substrate contacts are separated by two wavy lines of trenches 120.

Figure 4:
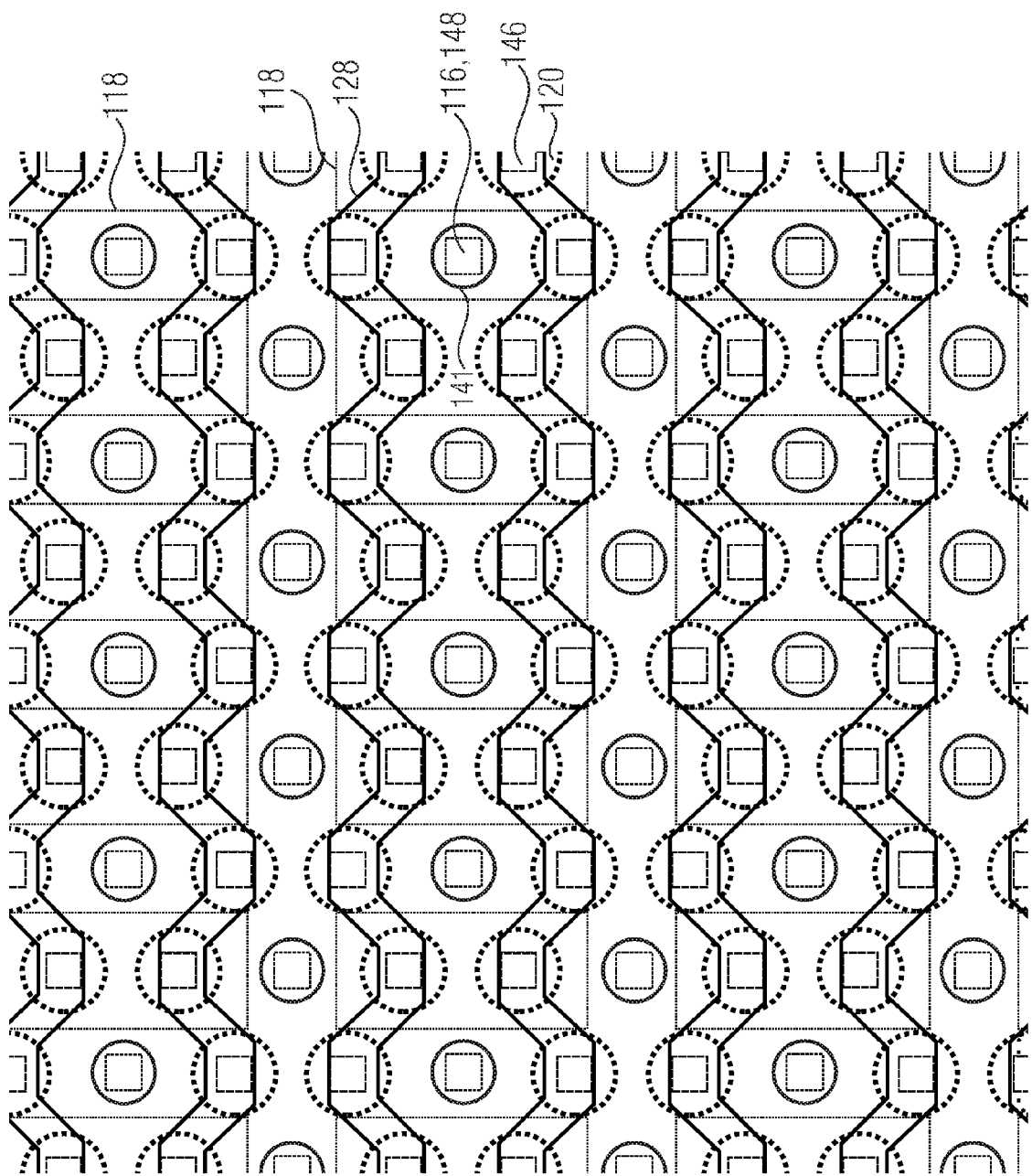
FIG. 4 shows another embodiment of a trench capacitor layout using a 6/1 cell.

FIG. 4 shows another embodiment of a capacitor 100, 200 with a layout using a 6/1 cell similar to FIG. 3. In contrast to FIG. 3, two consecutive rows or columns of substrate contacts 116 are separated only be one column of trenches 120. Furthermore, the substrate contact 116 is connected to a grid-like first conductor structure 118 comprising parallel lines in one direction and additionally further parallel conductor lines orthogonal to these.

Figure 5:
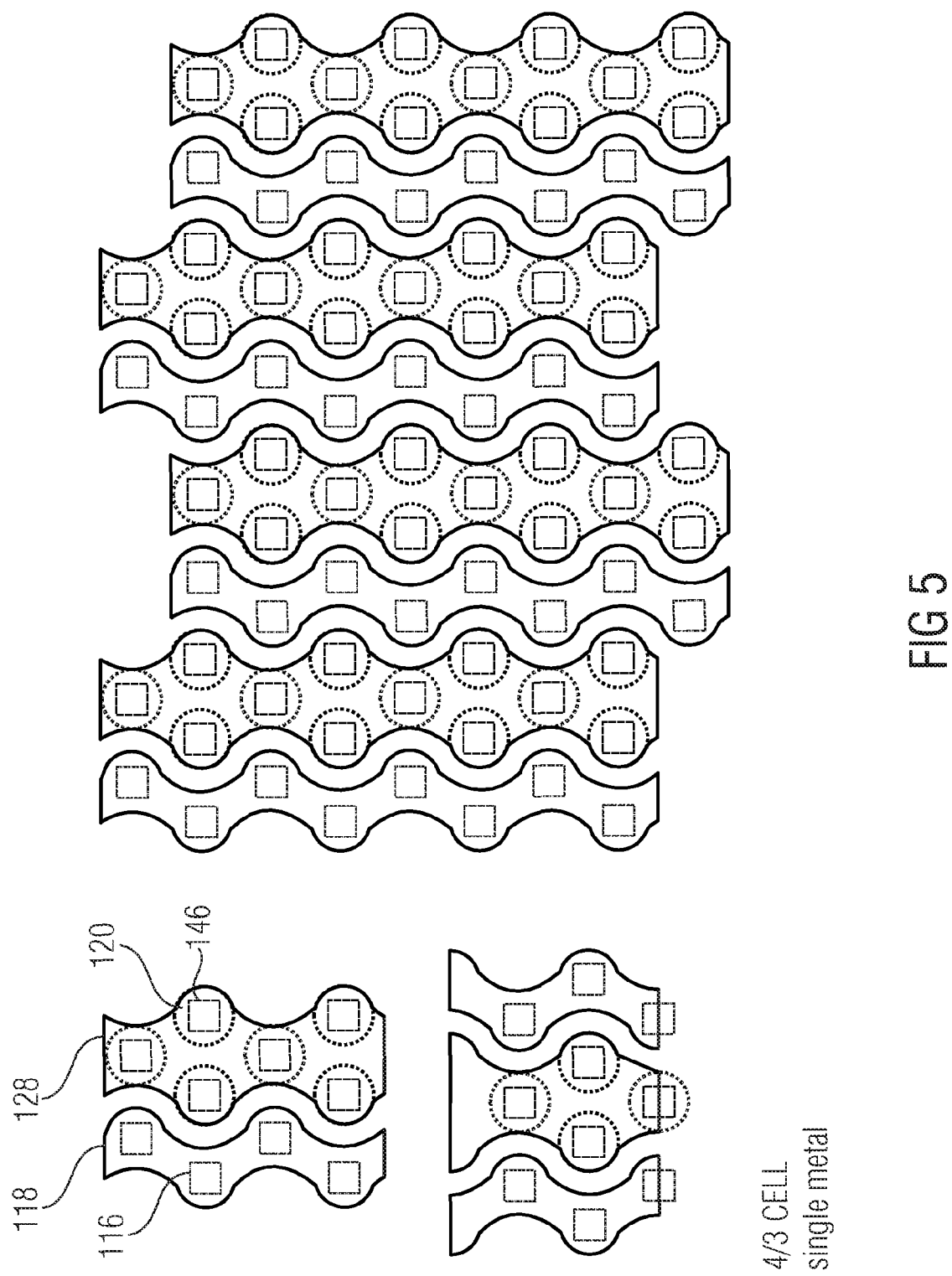
FIG. 5 shows an embodiment of a capacitor with a layout using a 4/3 cell and single metallization.

FIG. 5 shows an embodiment of a capacitor 100, 200 with a layout using a 4/3 cell and single metallization 140. The columns of the trenches 120 are formed by repeatedly arranging four trenches defining a rhombus. These trench columns are separated by wavy lines of substrate contacts 116.

In further embodiments of the capacitor according to FIG. 5, the distance between two consecutive trench columns is smaller than shown in FIG. 5, or in other words, the width of the wavy column of substrate contacts is smaller than shown in FIG. 5.

In further embodiments, the 4/3 cell is used together with a two layer metallization. Thus, no closed or continuous conductor structures are necessary and accordingly the distances between the trenches on one hand and between the trenches 120 and the substrate contacts 116 can be further reduced to obtain a higher packaging density.

Figure 6:
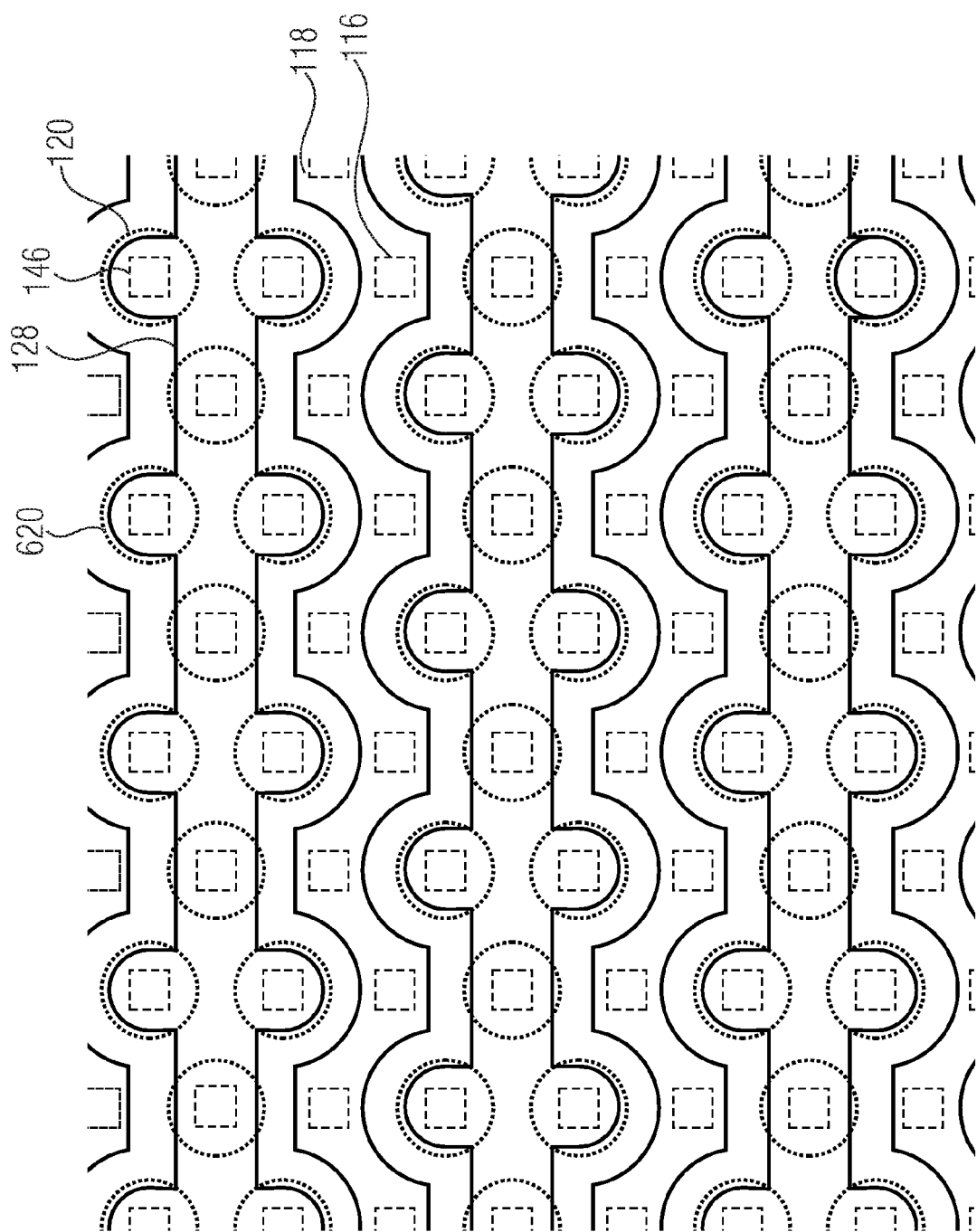
FIG. 6 shows another embodiment of a capacitor using a layout with a 4/3 cell and single metallization.

FIG. 6 shows another embodiment of a capacitor using a layout with a 4/3 cell and single metallization, similar to FIG. 5. In FIG. 6, the second conductive structure 128 has a straight structure with protrusions to connect trenches 620.

Figure 7:
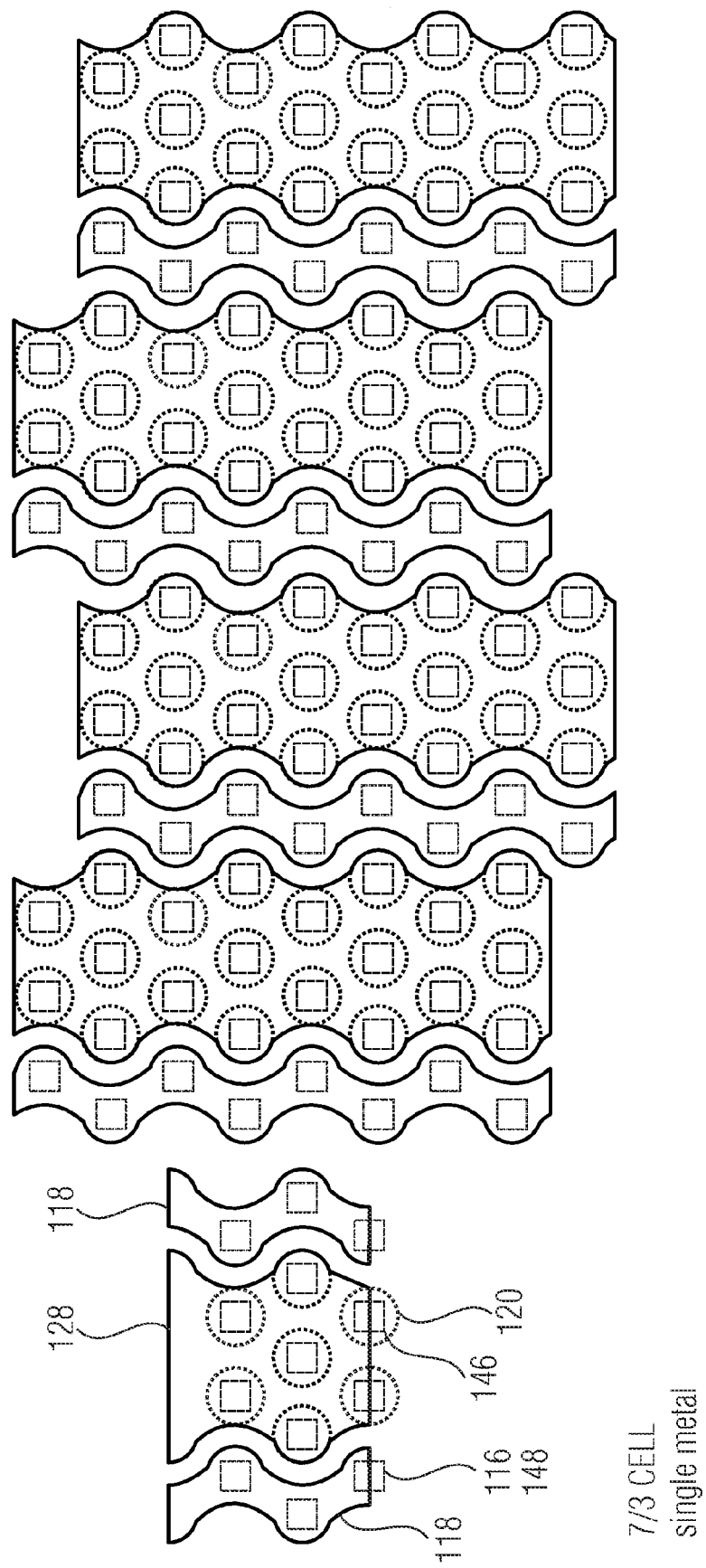
FIG. 7 shows an embodiment of the capacitor with a layout using a 7/3 cell and a single metallization.

FIG. 7 shows an embodiment of the capacitor with a layout using a 7/3 cell with 7 trenches and 3 substrate contacts 116 per cell and a single metallization 140 to connect the trenches and the substrate contacts. The 7/3 cell is a further development of the 4/3 cell to improve the trench to substrate contact ratio in single metallization layouts.

Figure 8:
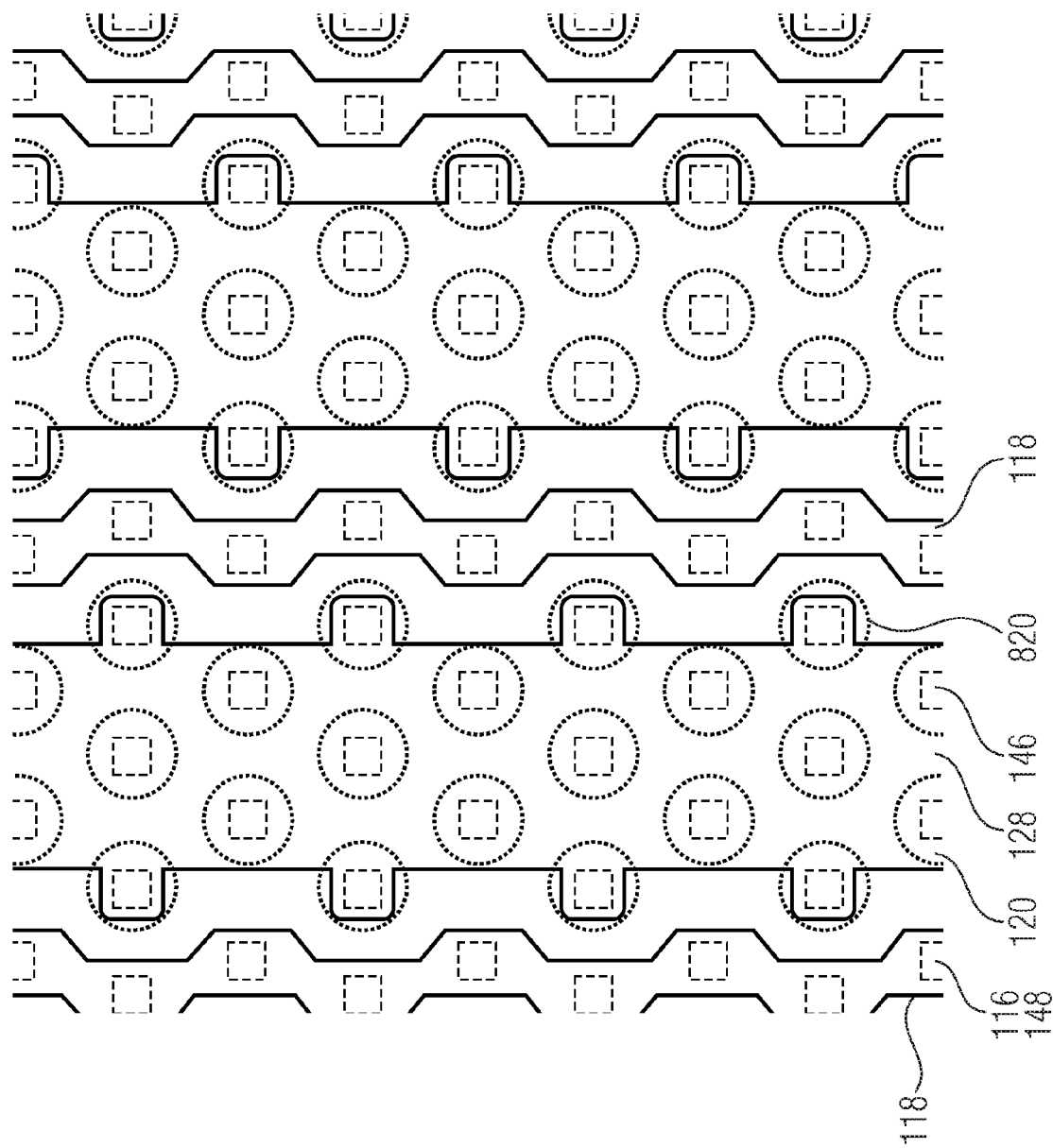
FIG. 8 shows an embodiment according to FIG. 7, wherein the second conductor pattern is a straight conductor line.

FIG. 8 shows an embodiment according to FIG. 7, wherein the second conductor pattern 128 is a straight conductor line with protrusions to contact trenches 820.

FIG. 9 shows an embodiment of a capacitor based on a layout with a 24/1 cell as shown in the top left corner of FIG. 9. A 24/1 cell comprises an inner hexagon of 6 trenches 120 and an outer hexagon of trenches with 12 trenches 120 surrounding the inner hexagon of trenches. The 24/1 cell comprises a substrate contact 116 in the center area of the inner hexagon. As can be seen from FIG. 9, the 24/1 cell allows high packaging of trenches with a high trench to substrate contact ratio.

Figure 10:
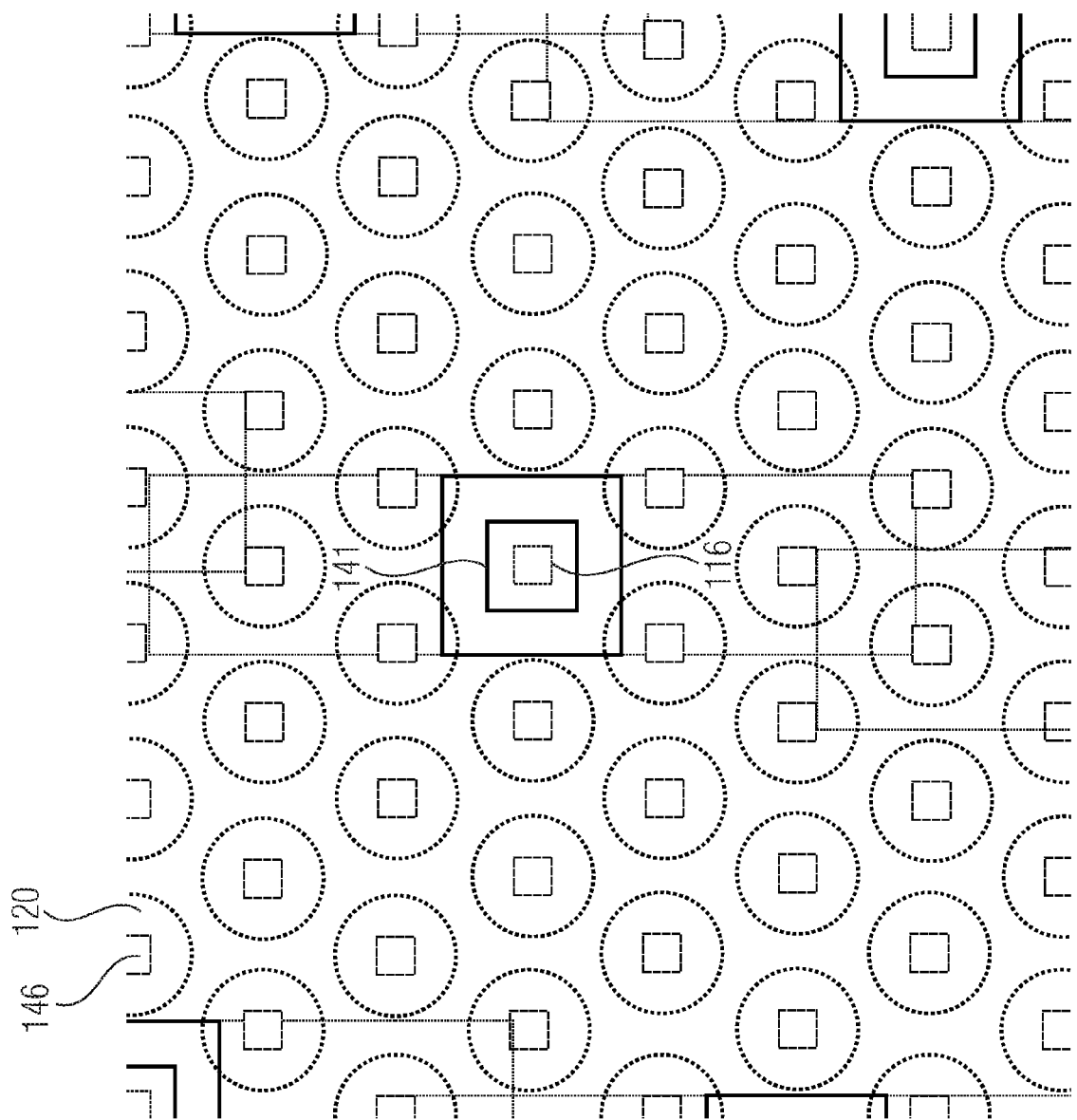
FIG. 10 shows another embodiment according to FIG. 9.

FIG. 10 shows another embodiment according to FIG. 9.

Figure 11:
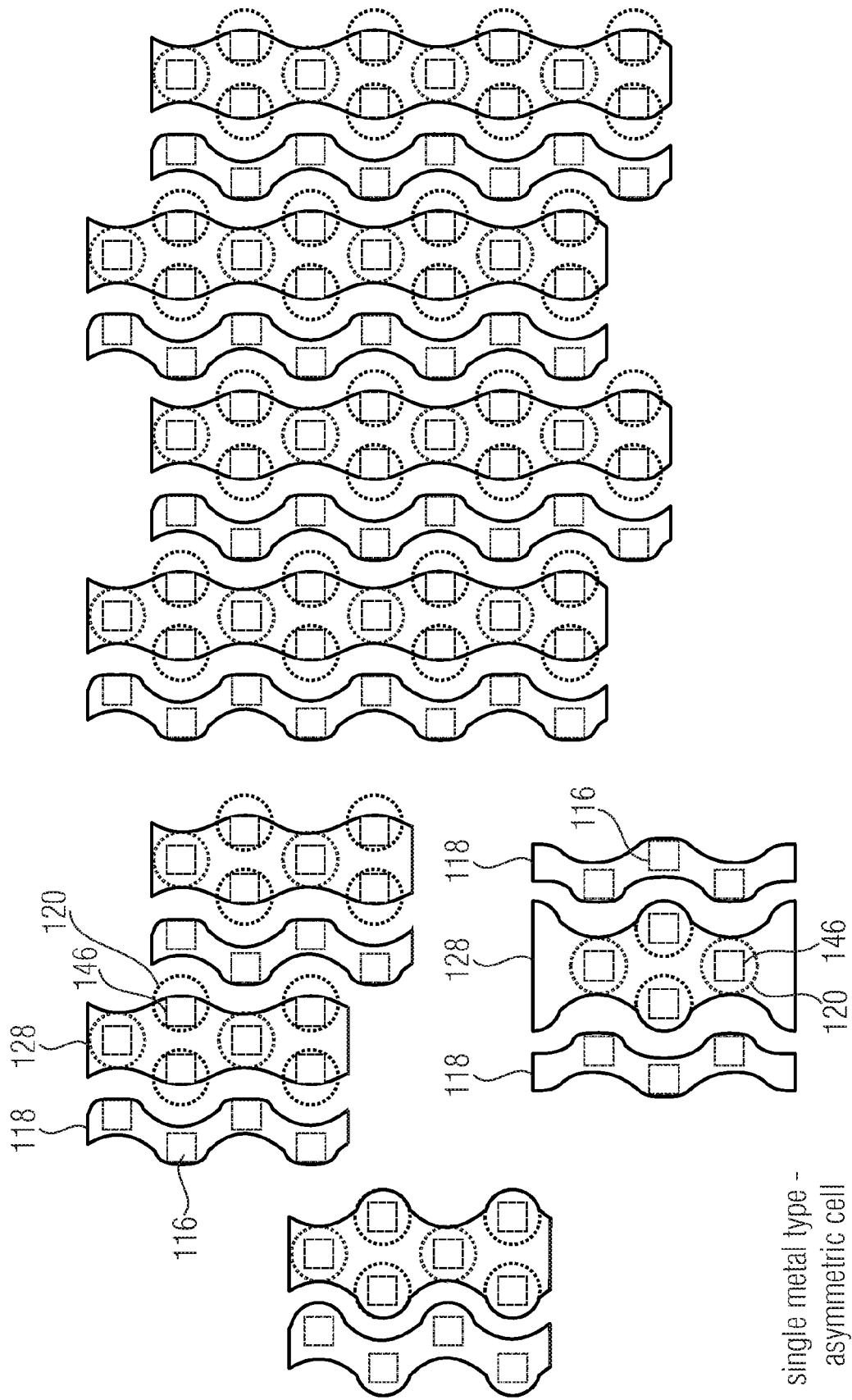
FIG. 11 shows a further development of the 4/3 cell shown in FIG. 5.

FIG. 11 shows a further development of the 4/3 cell as shown in FIG. 5 (for comparison purposes the embodiment according to FIG. 5 is also shown in the left hand mid to lower part of FIG. 11). The contacts or contact holes of the trenches 120 are moved from the center of the trench 120 towards its perimeter, or in other words, they are arranged excentrically. The excentric arrangement of the contact holes produces a widening of the geometry, which allows to linearize the course of the first and second conductor structures 118, 128. A more dense arrangement of the trenches, or in other words, a higher packaging density is possible, and a higher trench to substrate contact ratio is possible.

As can be seen from the lower left part of FIG. 11, a minimum distance between two parallel structures 118 and 128 can be achieved by arranging the contact holes in an excentric manner.

A comparison between the embodiments of FIG. 11 and FIG. 5 clearly shows the linearizing effect of the excentric arrangement of the contact holes for both, the first and the second conductor structure 118, 128.

Figure 12:
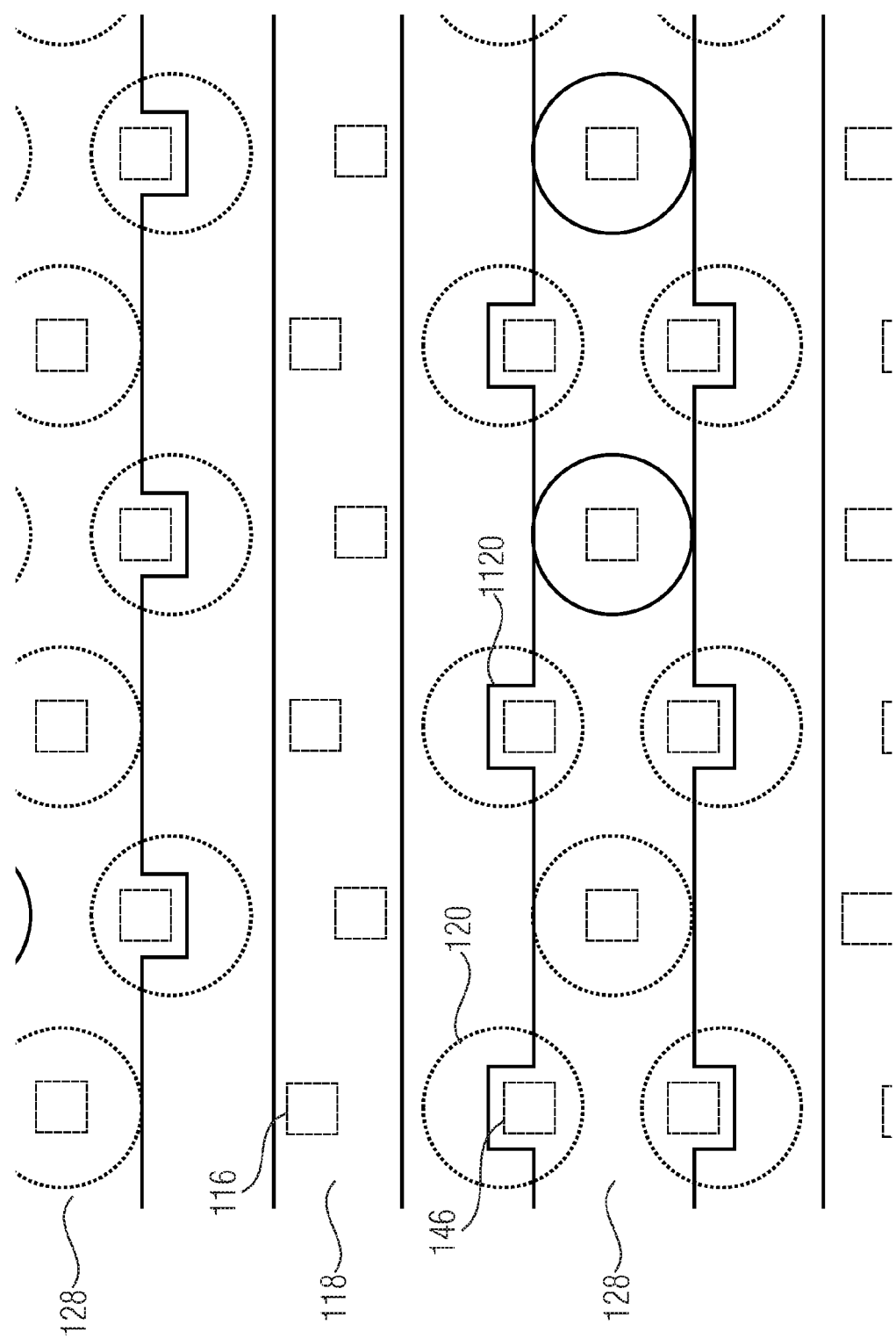
FIG. 12 shows another embodiment of the capacitor according to FIG. 11.

FIG. 12 shows another embodiment of the capacitor according to FIG. 11, where the substrate contacts are connected by straight conductor structures 118 and the trenches 120 by straight conductor structures 128, wherein the straight conductor structures 128 have small protrusions 1120 to connect the trenches 120 via their eccentric contact holes.

Figure 13:
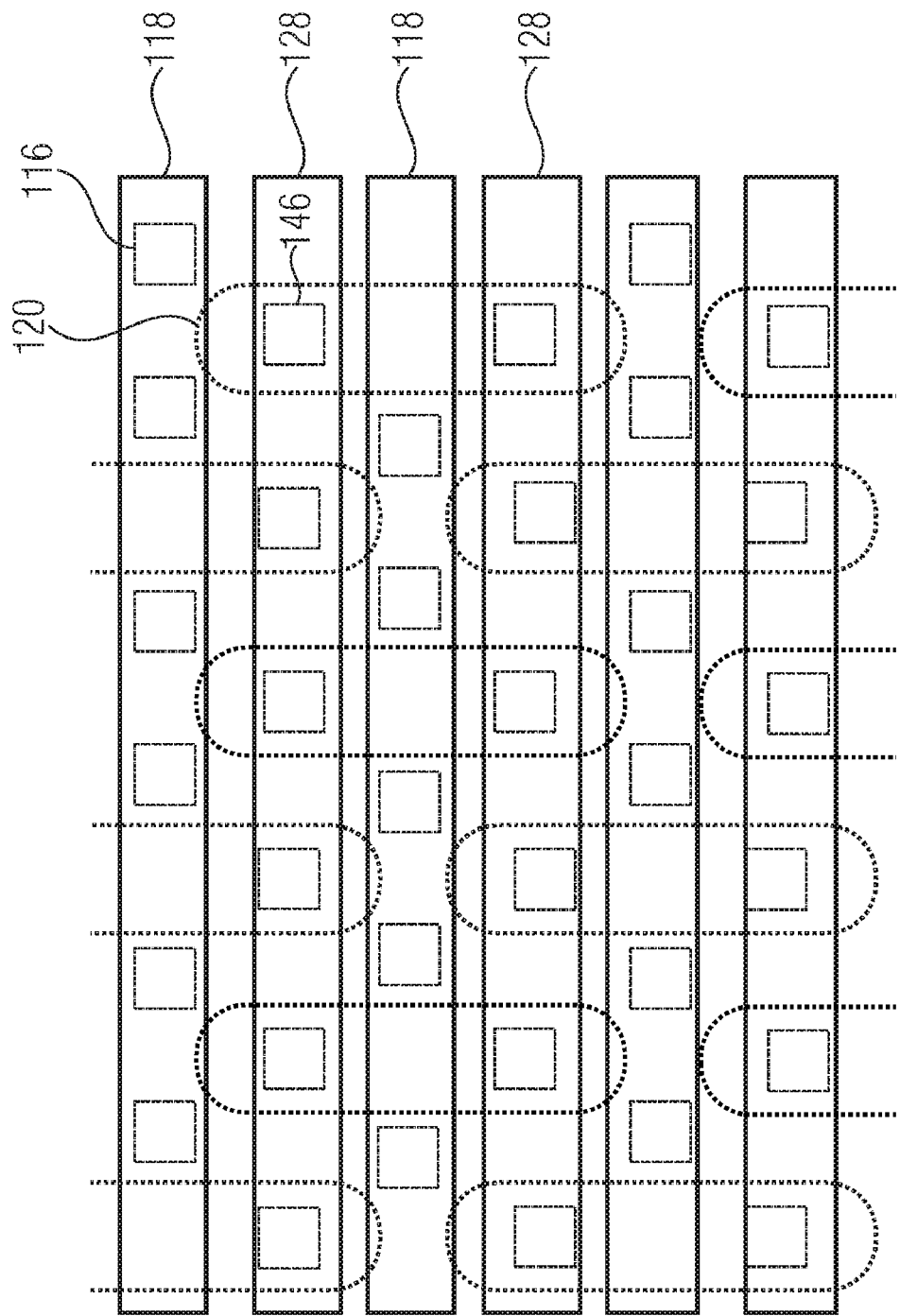
FIG. 13 shows an embodiment of a capacitor with cigar cells.

FIG. 13 shows an embodiment of a capacitor with cigar cells, or in other words, with trenches 120 having a cigar-shape open area. This is a compact design with a larger open trench area, which allows for larger trench depths and thus, for higher specific capacities. Each trench has on its both long end sides contacts 146 connected to different, parallel second conductor structures 128. The trenches 120 are arranged in columns, which are shifted with regard to each other to form larger second open areas A2, compared to capacitors with cigar-shape cells arranged in a matrix order. FIG. 13 shows an embodiment with one metallization layer 140, where the first conductor structure 118 is arranged in parallel to the second conductor structure 128.

The minimum trench to trench distances are determined by the substrate contact holes. A possible loss of trench surface area, compared to, e.g., two single circular trenches, can be compensated or even surpassed due to the increased trench depth.

Figure 14:
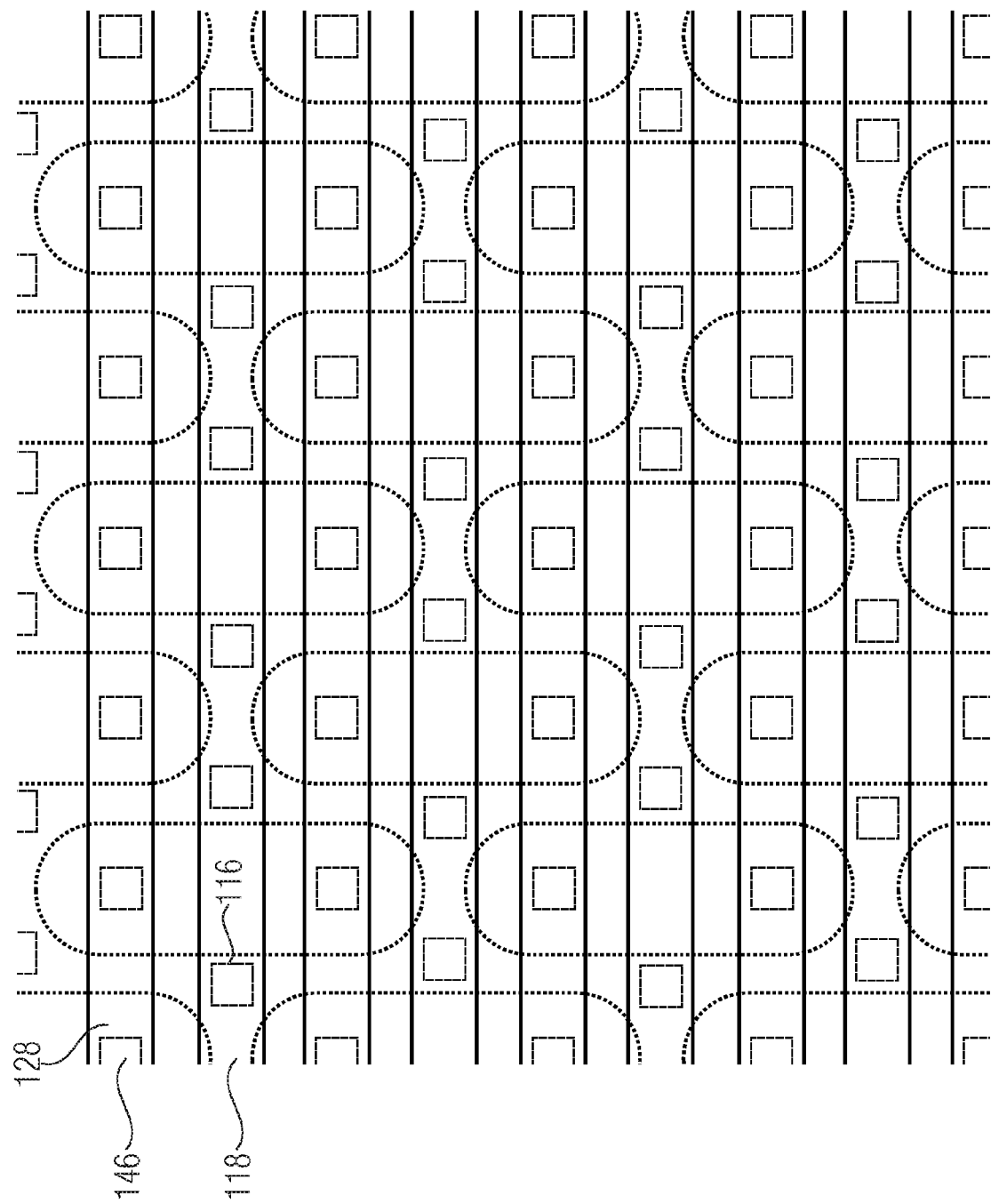
FIG. 14 shows another embodiment of a capacitor according to FIG. 13.

FIG. 14 shows another embodiment of the capacitor according to FIG. 13.

Figure 15:
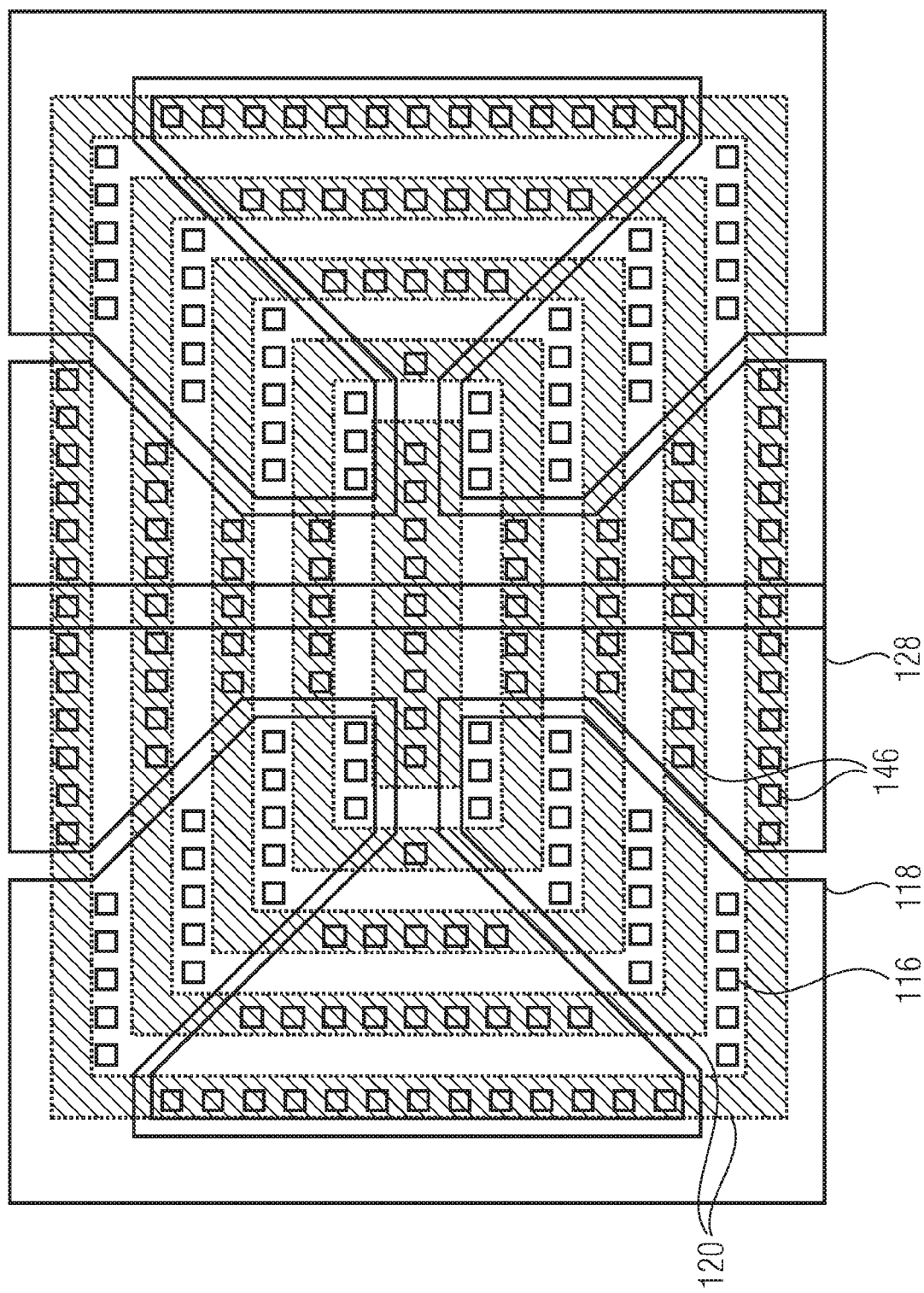
FIG. 15 shows a capacitor with a layout based on a circular cell design.

FIG. 15 shows a capacitor with a layout based on a "circular cell design", which can also be referred to as concentric cell design, wherein the trenches share the same center, axis or origin, and wherein one trench is arranged inside another. The large open trench areas (dashed areas) allow for large trench depths. Furthermore, due to their circular or concentric structure, the structures are more robust compared to substrate columns.

Embodiments of the capacitor comprise concentric trenches, wherein an open area of a concentric trench of these concentric trenches comprises an inner concentric border line and an outer concentric borderline, defining the open area of the concentric trench.

Further embodiments of the capacitor comprise concentric trenches, wherein the inner borderline and the outer borderline are closed concentric borderlines. In further embodiments, the inner and outer concentric borderlines or at least corresponding segments of the inner and outer concentric borderlines are parallel to each other.

The inner and outer concentric borderlines can have a square, rectangular (see FIG. 15), triangle, true "circular", oval, or any other shape.

Figure 16:
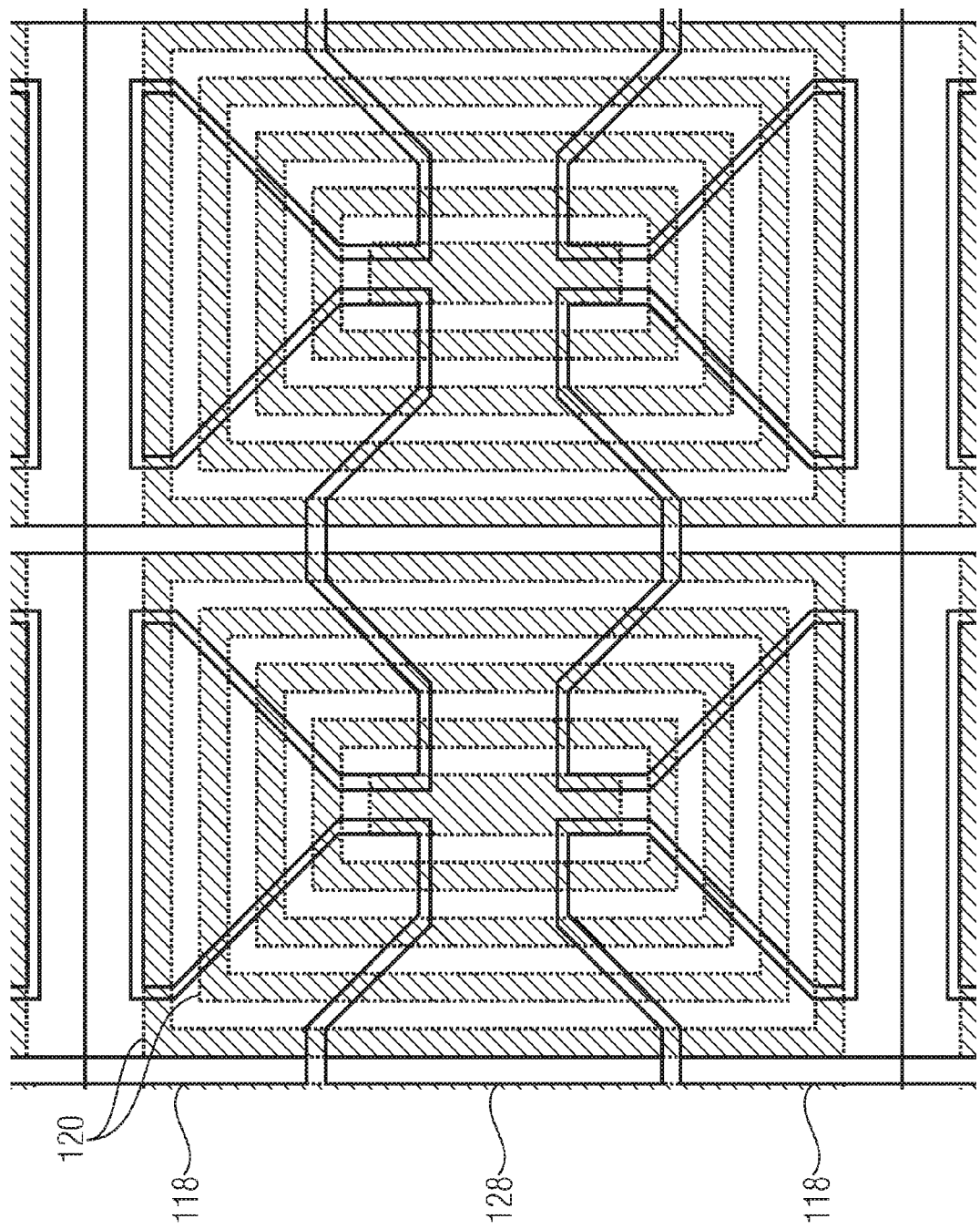
FIG. 16 shows two circular cells similar to FIG. 15.

FIG. 16 shows two circular cells similar to FIG. 15, wherein further cells can be arranged on the top side, bottom side, left and right hand sides of the two cells to form a large capacitor.

Figure 17:
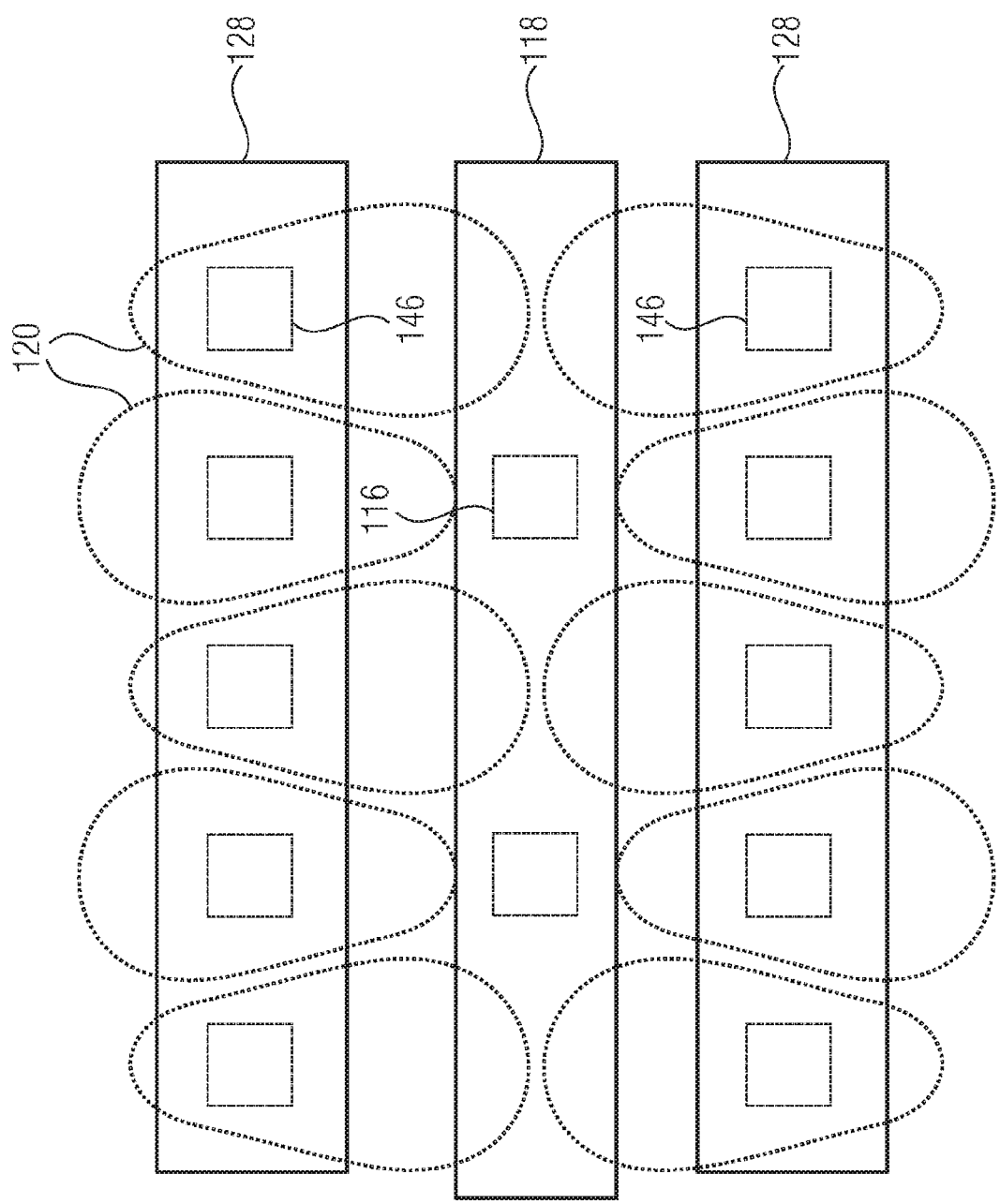
FIG. 17 shows an embodiment of a capacitor with a layout based on a first "bubble cell" design.

FIG. 17 shows an embodiment of a capacitor with a layout based on a first "bubble cell" design. Each "bubble" has a first end with a larger radius and a second end with a smaller radius, wherein the perimeter of both ends are connected by essentially straight lines. The bubble cells are arranged in columns and within each column in an alternating direction with regard to their first and second ends, such that a second open area with sufficient dimension is created for low series resistances and at the same time the distance between neighboring bubble cells at their long sides can be kept small. The asymmetric bubble form allows for higher trench depths in the broader part of the bubble cell. Additionally, the contact or contact holes can be arranged in asymmetric or excentric positions, to allow for a connection via straight first and second conductor structures 118, 128, as shown in FIG. 17.

The reduced packaging density of this layout can be compensated and surpassed due to higher trench depths. Thus, a higher specific capacitance can be achieved.

Figure 18:
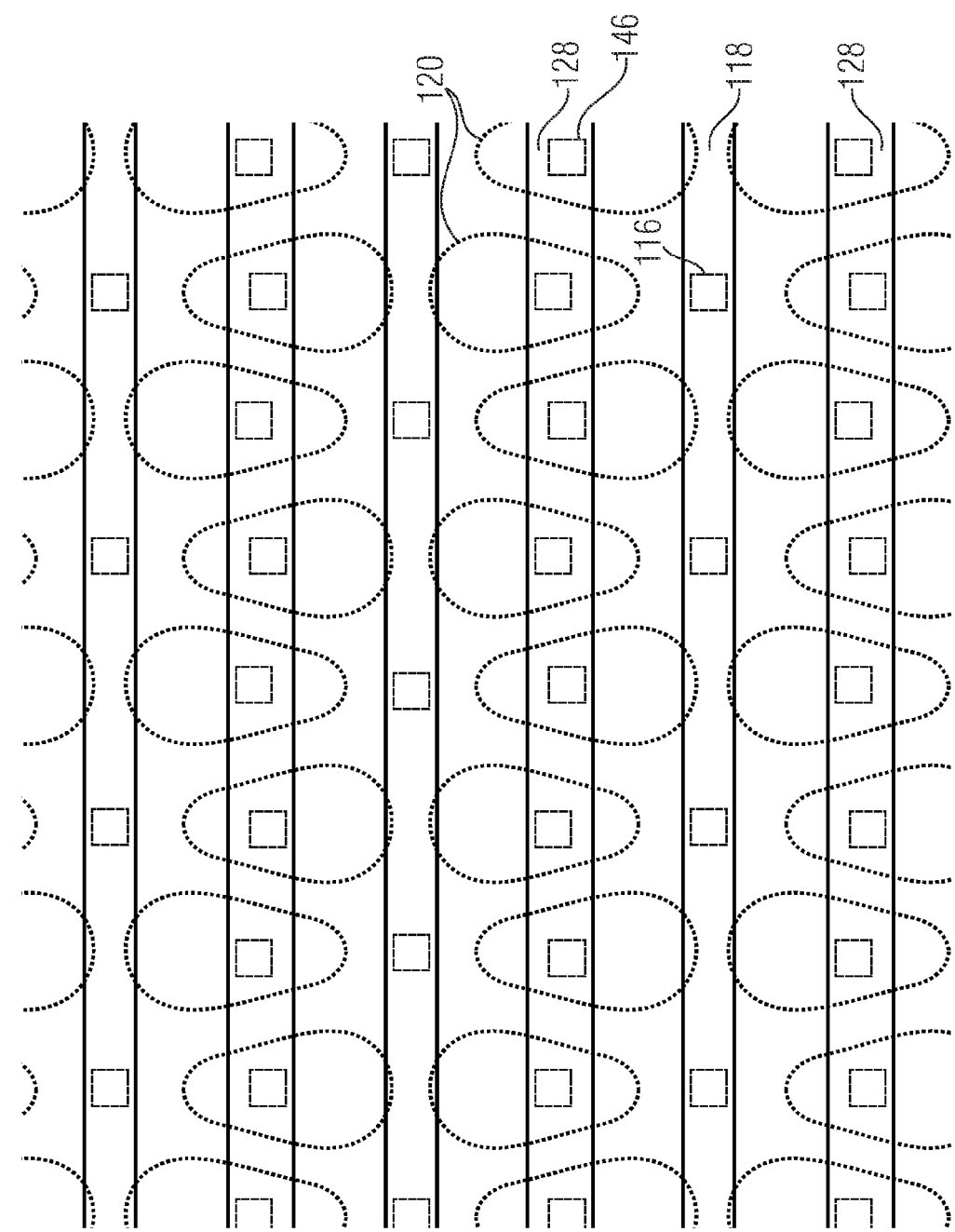
FIG. 18 shows another embodiment of a capacitor according to FIG. 17.

FIG. 18 shows another embodiment of a capacitor according to FIG. 17.

Figure 19:
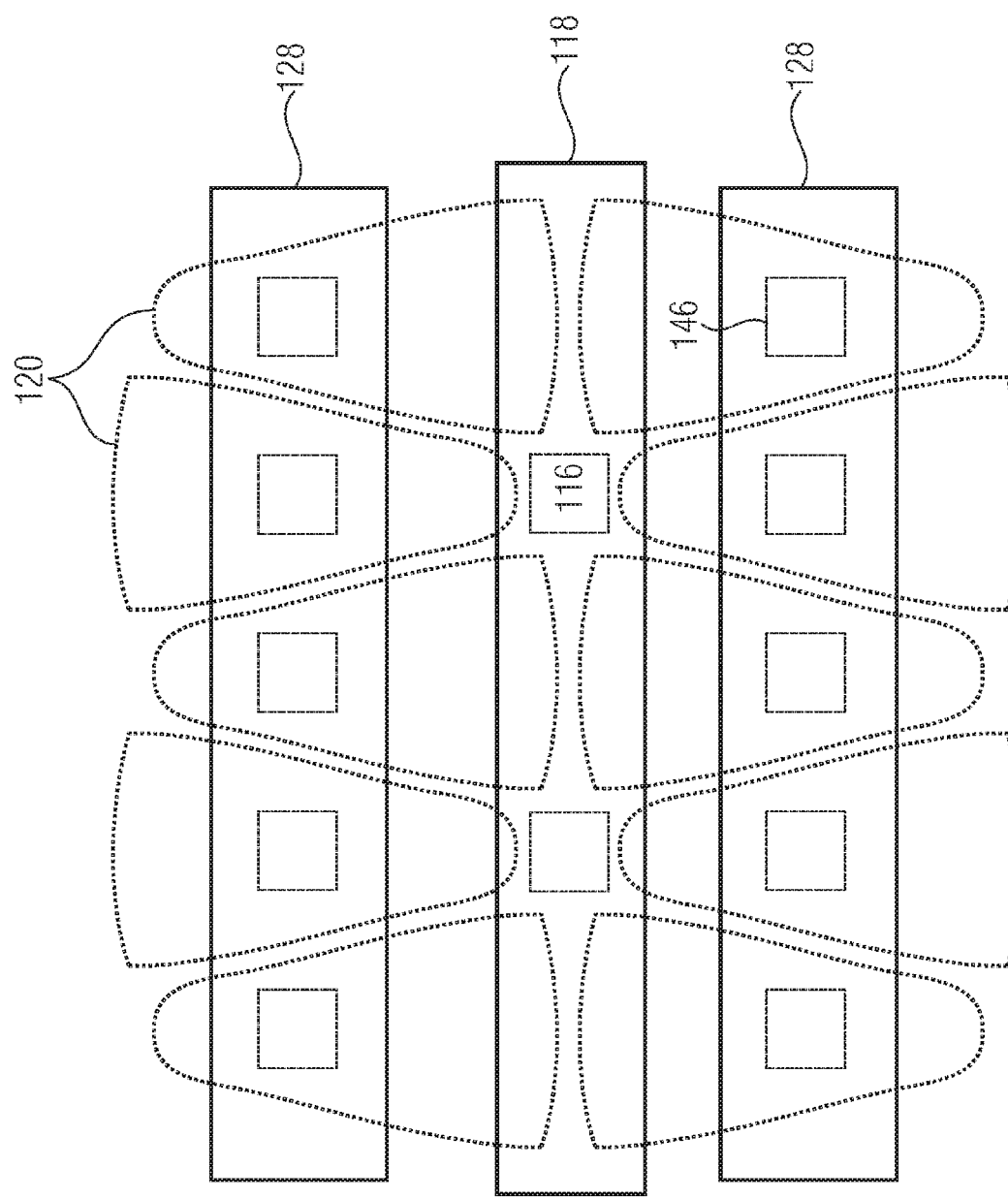
FIG. 19 shows an embodiment of a capacitor with a second bubble cell design.

FIG. 19 shows an embodiment of a capacitor with a second bubble cell design, which is a further development of the first bubble cell shown in FIGS. 17 and 18, and which more efficiently uses the areas near to the substrate contacts. As for the embodiments according to FIGS. 17 and 18, the asymmetric bubble form allows, in the broader part of the trench, an increased trench depth. Furthermore, as for the embodiment shown in FIGS. 17 and 18, the contacts or contact holes can be arranged in an excentric manner.

Figure 20:
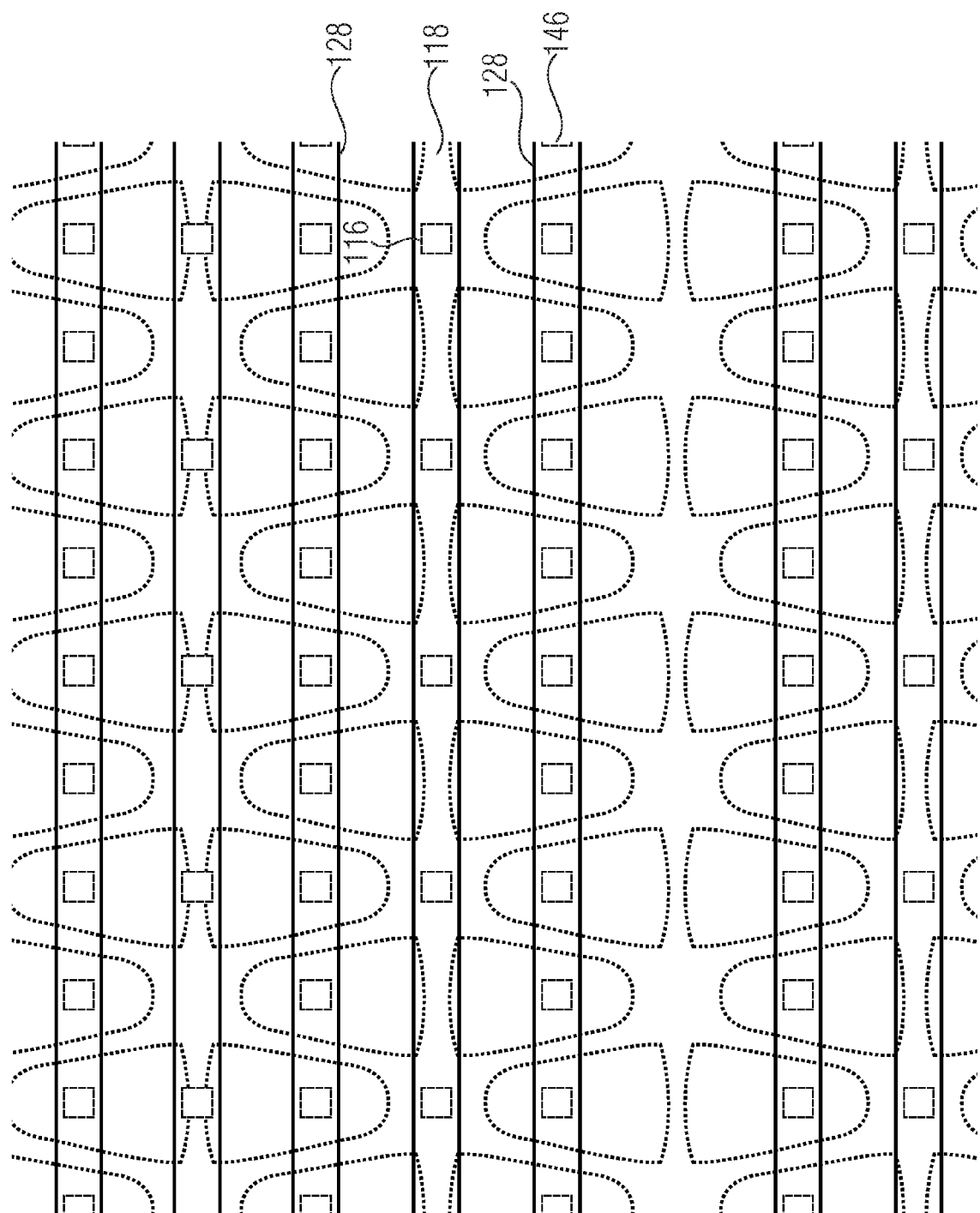
FIG. 20 shows another embodiment of a capacitor according to FIG. 19.

FIG. 20 shows another embodiment of a capacitor according to FIG. 19.

Figure 21:
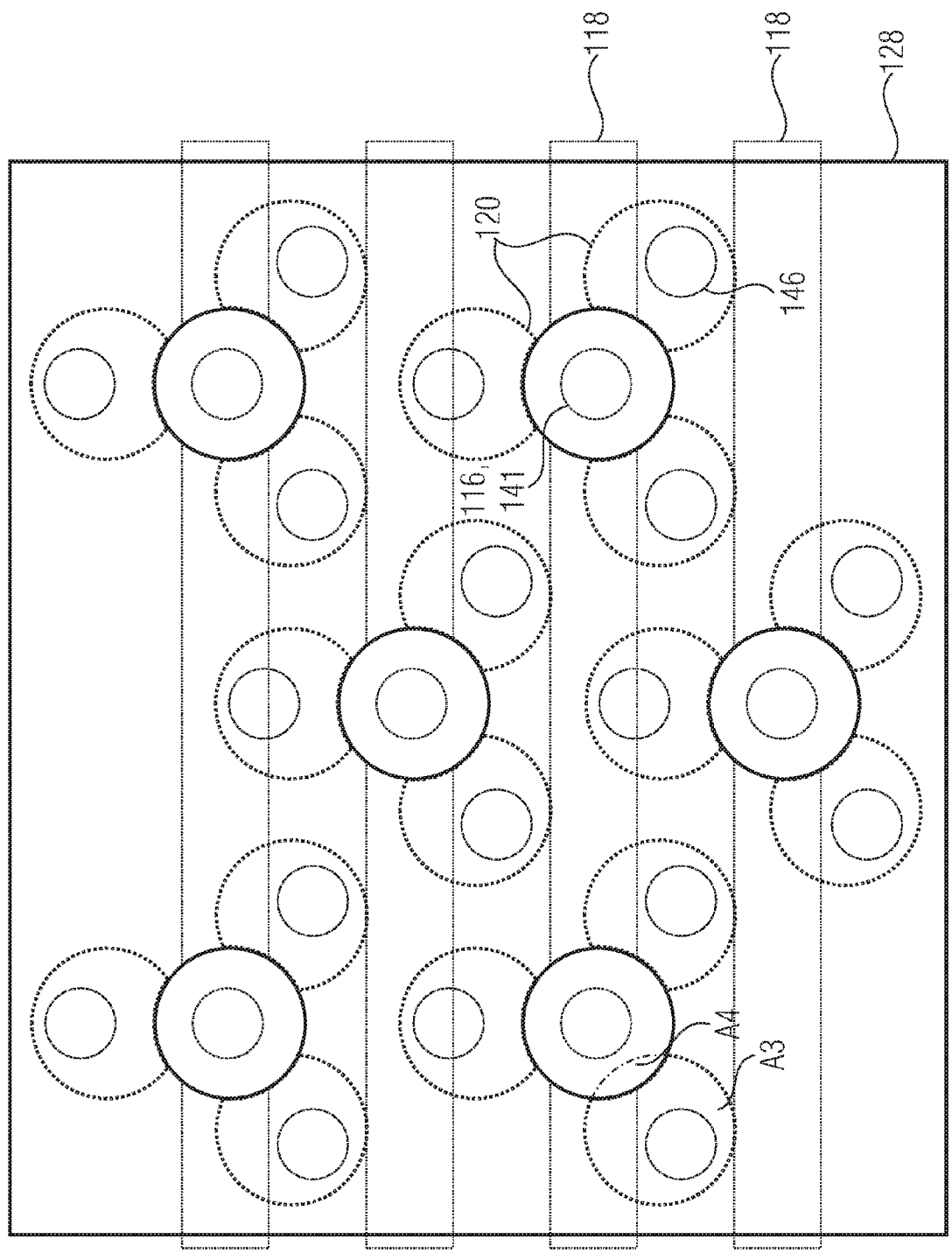
FIG. 21 shows an embodiment of a capacitor with a layout based on a "biteit cell"

FIG. 21 shows an embodiment of a capacitor with a layout based on a "biteit cell". The basis for this cell type is a "folding down of a part of the circular form towards the inside of the circle". In case the maximum resolution is high, there is no loss of surface area or in the perimeter of the open area of the trench, and at the same time, sufficient space and second open area A2 for the substrate contact can be created.

The high trench open area combined with the high packaging density allows to surpass the effect of the reduced trench depth due to the reduced trench open area. Additionally such designs allow for high packaging densities combined with high numbers of substrate contacts, and thus, for capacitors with high capacity and high quality at the same time.

Figure 22:
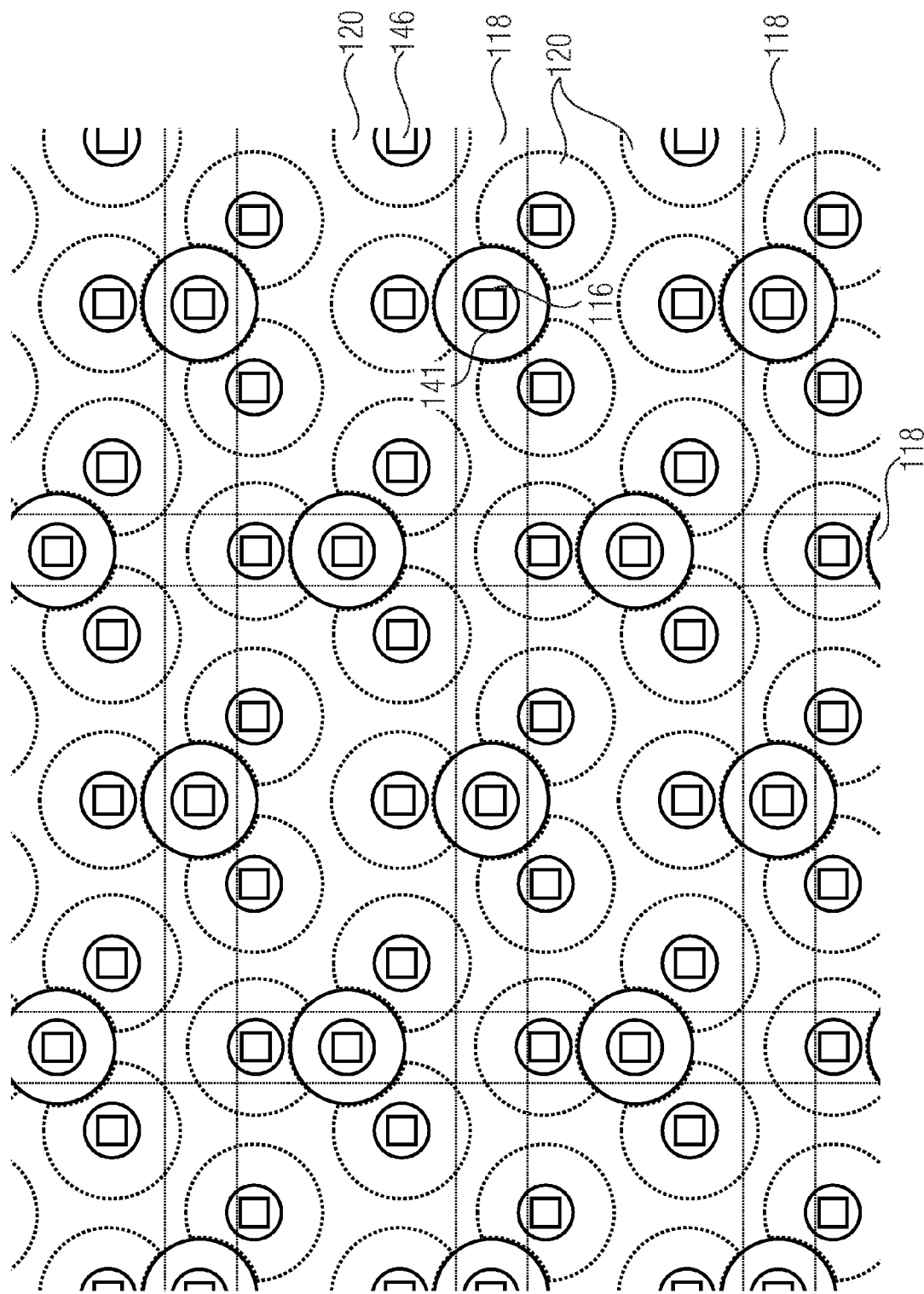
FIG. 22 shows another embodiment according to FIG. 21 with two metallization layers.

FIG. 22 shows another embodiment according to FIG. 21 with two metallization layers 140, 150.

Figure 23:
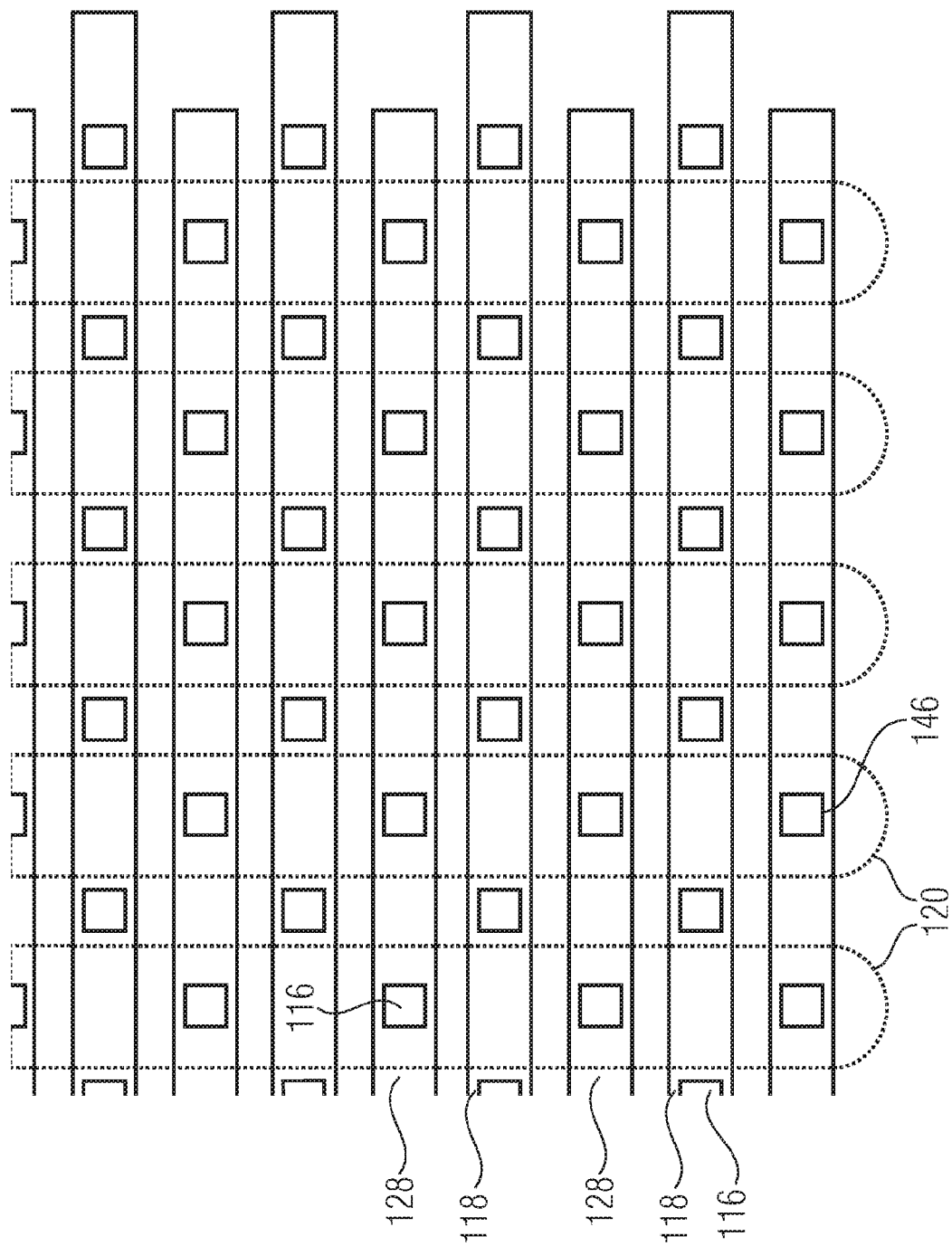
FIG. 23 shows an embodiment of a capacitor with a layout based on "long line cell"

FIG. 23 shows an embodiment of a capacitor with a layout based on "long line cells". The basis for this cell type is the long, straight lines of the trench, which reduce the effect of varying dimensions.

Figure 24:
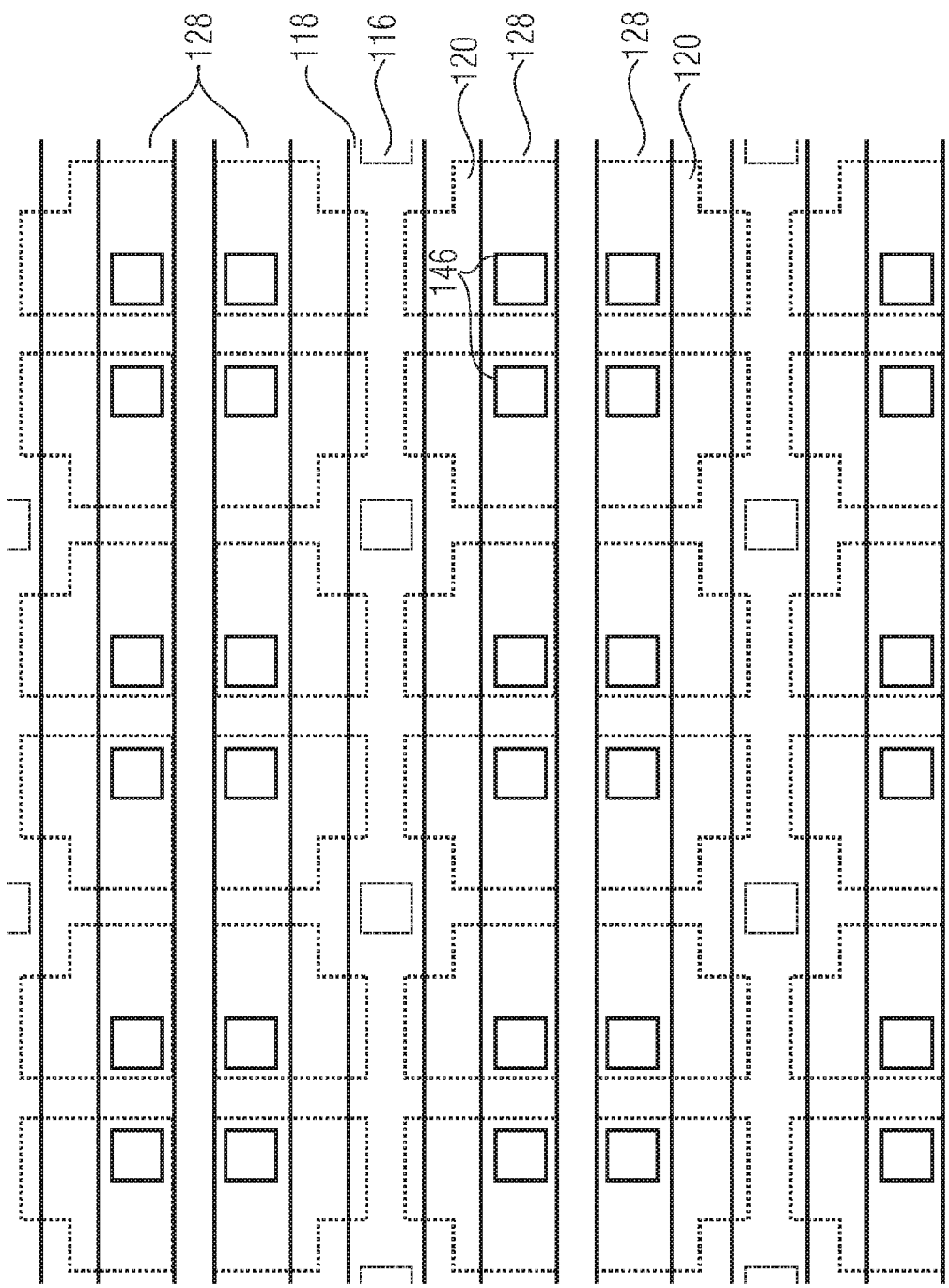
FIG. 24 shows an embodiment of a capacitor with a layout based on an "edge in edge cell"

FIG. 24 shows an embodiment of a capacitor with a layout based on an "edge in edge cell", as already described based on FIGS. 1E to 1H. The basis for this cell type is that from squares, smaller squares are cut out to increase the invaluable area for the substrate contact. This cell type guarantees the largest space exploitation and can be used with a single metallization structure.

Measurements of capacitors using a square design derived from the aforementioned "edge in edge cells" were successful. Electrical measurements showed a significant increase of the specific capacity ($fF/\mu m^2$) in comparison with known designs.

An essential additional advantage of the square cell is the usage of only one omitted sacrifice trench per bottom plate contact or substrate contact (the sacrifice trench is not etched, instead at this position the substrate contact is placed), as well as a considerably improved tolerance with regard to maladjustment.

Figure 25:
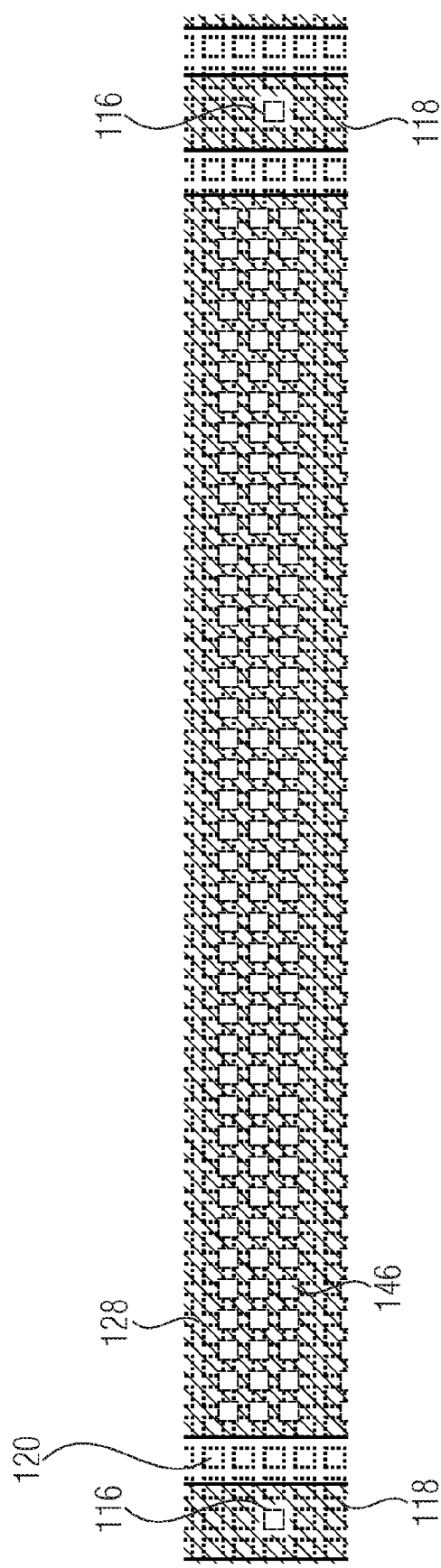
FIG. 25 shows a further embodiment of a high capacity capacitor.

FIG. 25 shows an embodiment of a capacitor with a large number of trenches 120, connected via a conductive plate, wherein the doped area of the substrate is connected via one substrate contact 116 per cell (refer also to FIG. 1E). The capacitor according to FIG. 25 is connected via a single metallization, wherein the first conductor structure 118 is arranged in parallel to the second conductor structure 128, and the conductive plate is contacted by a large number of contact holes or contacts. In particular, the cells with the omission (see FIGS. 22 and 24), have the advantage that due to the "folding in", the open area necessary for the substrate contact can be achieved in a sufficient manner and at the same time, the surface area or coat area of the trenches remains unchanged, but at the same time the quality or Q-factor of the capacitor is increased.

It should be noted that for the abovementioned embodiments and layouts, variations with regard to the diameter of the trenches, the distance between the trenches, the number of trench contacts and substrate contacts and the arrangement of the trench contacts and substrate contacts as well as trenches with circular or angular forms, or circular or angular forms with omission for the substrate contact are possible.

Further embodiments include a chip with a substrate, an integrated circuit integrated into the substrate, and an integrated capacitor, also integrated into the substrate of the chip and connected to the integrated circuit. The integrated capacitor can be one of the embodiments of the capacitors.

Embodiments of such chips can, e.g., be used in mobile communication devices covering a large range of capacity values.

In the following, methods for producing embodiments of the capacitor are described.

In a first production step, a substrate 110 is provided, and the trenches 120 created in the semiconductor substrate 110 through etching. The substrate can be formed of single-crystalline silicon, but other materials are also possible. In a consecutive step, the doped area 112 is created by, for example, phosphorous doping of the semiconductor substrate 110 through the surface of the trenches 120. First a phosphorous-doped layer is created on the surface of the trenches 120 and, afterwards, the chip or substrate is heated to cause a diffusion of the phosphorous as doping material into the substrate. After this doping step, the phosphorous-doped layer on the surface of the trenches 120 is removed by etching, for example, with HF.

A typical doping achieved during this doping step achieves a doping density in a region greater than $10^{18}$ cm$^{-3}$. Thus, a doped area with high electrical conductivity can be produced.

Using the trenches for doping ensures that a high doping can be achieved, even for deep trench structures which extend, for example, down to depths of multiples of 10 µm. Thus, compared to conventional doping from the upper surface of the substrate, even at the lower regions of the substrate, sufficient doping can be achieved to assure highly conductive doped areas, or in other words, low series resistance values for the substrate area forming the first electrode of the capacitor.

In a next step, the dielectric layer 114 is deposited on the surface of the trenches 120 and, depending on the connecting structure arranged above the substrate, also on parts of the substrate surface.

Embodiments of the dielectric layer may comprise, for example, SiO$_2$, a silicon nitride, or ONO (oxide-nitride-oxide stack).

Afterwards, the filling material is introduced into the trenches 120.

In embodiments, using conductive plates 142, for example, poly-crystalline silicon plates, or in short, polyplates, the same filling material can also be used to create the conductive plate 142 on top of the trenches and the insulating layers, insulating the conductive plate 142 from the doped area 112. Filling materials can comprise poly-silicon, or, for example, Tungsten. Poly-crystalline silicon has a high electrical conductivity and a good adhesion in a dielectric layer of SiO$_2$. Furthermore, it is also easy to apply with the known silicon technology. However, every other electrically conductive material may be used as filling material.

In further steps, the connecting structure, as, for example, described based on FIGS. 2A and 2B are produced in a known manner.

Silicide layers formed by a self-aligned silicide process can be implemented on top of a poly-plate, the trenches as trench contact structures, or as substrate contact structures, because silicide layers provide a good electric contact between the filling material, for example, poly-crystalline silicon and the further connecting structures as described based on FIGS. 2A and 2B.

Embodiments of the capacitor are, for example, produced based on deep reactive ion etching. A variety of deep reactive ion etching processes to create deep, steep side holes in trenches and wafers are known.

The semiconductor substrate 110 can be a substrate already doped in advance of producing the capacitor or a low doped semiconductor substrate doped via the trenches during the production process of the capacitor.

The doped area of the semiconductor substrate and the trenches can be both contacted on the upper side of the substrate. Thus, integration of embodiments of the capacitor with other devices or circuits are possible.

Furthermore, a highly ohmic substrate can be used that may be doped in a locally restricted manner by the trench, wherein the creation of an insulation to adjacent circuit parts integrated in the substrate is not necessary due to the use of the highly ohmic substrate. Furthermore, ohmic losses by electromagnetic coupling are thereby minimized.

To summarize the aforementioned, embodiments of the present invention provide a capacitor and a method for producing a capacitor with a specific capacity as high as possible by making the most out of layout-improvement possibilities.

Current trench-capacitor layouts comprise either an arrangement or pattern of circular geometric derivatives, which have been primarily designed for the use in DRAMs (Dynamic Random Access Memory). Further known trench capacitors are produced using the aforementioned anisotropic ion etching.

The layout-variations explained provide an optimization of the order of contacts to the deep trench structures and the metal contactor lines 118, 128, and serve for increasing the specific capacity.

Depending on certain implementation requirements of the inventive methods, the inventive methods can be implemented in hardware or in software. The implementation can be performed using a digital storage medium, in particular a disk, DVD or a CD having electronically readable control signals stored thereon, which cooperate with a programmable computer system such that the inventive methods are performed. Generally, the present invention is, therefore, a computer program product with a program code stored on a machine-readable carrier, the program code being operative for performing the inventive methods when the computer program product runs on a computer. In other words, the inventive methods are, therefore, a computer program having a program code for performing at least one of the inventive methods when the computer program runs on a computer.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

What is claimed is:

1. An integrated circuit comprising:
   a substrate with a doped area, the doped area forming a first electrode of a capacitor;
   a plurality of trenches arranged in the doped area of the substrate, at least one of the trenches forming a second electrode of the capacitor;
   at least one dielectric layer arranged between each of the at least one of the trenches and the doped area for electrically insulating the trenches from the doped area; and
   at least one substrate contact structure for electrically connecting the doped area,
   wherein the doped area comprises first open areas arranged between neighboring trenches of the plurality of trenches and at least one second open area arranged between neighboring trenches, wherein the at least one second open area is arranged below the at least one substrate contact structure, wherein a shortest first distance between the neighboring trenches separated by the first open areas is shorter than a shortest second distance between the neighboring trenches separated by the at least one second open area, wherein no other trench is arranged in the substrate between the neighboring trenches separated by the first open areas, and wherein no other trench is arranged in the substrate between the neighboring trenches separated by the at least one second open area.

2. The integrated circuit according to claim 1, wherein the shortest second distance is a shortest distance between the neighboring trenches of the plurality of trenches separated by the at least one second open area through a straight line through a center point of the substrate contact structure.

3. The integrated circuit according to claim 1, wherein the shortest second distance is the shortest distance between the neighboring trenches of the plurality of trenches separated by at least one second cross-section through a center point of the at least one second open area.

4. The integrated circuit according to claim 1, wherein a minimum distance between opposite sides of the at least one second open area is larger than a minimum distance between opposite sides of the first open areas.

5. The integrated circuit according to claim 1, wherein an area of the at least one second open area is larger than an area of the first open areas.

6. The integrated circuit according to claim 1, wherein the first open areas are areas between at least three neighboring trenches.

7. The integrated circuit according to claim 1, wherein the at least one second open area is an area between at least three neighboring trenches.

8. The integrated circuit according to claim 1, comprising at least one trench contact structure for electrically connecting at least one of the plurality of trenches.

9. The integrated circuit according to claim 8, wherein a center point of an open area of the at least one trench contact structure is shifted with regard to a midpoint of a trench open area of the at least one of the trenches.

10. The integrated circuit according to claim 9, wherein the midpoint of the trench open area is a point within the trench open area having a maximum distance to a borderline of the trench open area.

11. The integrated circuit according to claim 8, comprising a first conductive structure and a second conductive structure, wherein the at least one trench contact structure is electrically connected to the first conductive structure, and wherein the at least one substrate contact structure is electrically connected to the second conductive structure.

12. The integrated circuit according to claim 11, wherein the first and the second conductive structures are lateral conductive structures.

13. The integrated circuit according to claim 11, wherein the first and the second conductive structures are arranged in a same layer of the capacitor.

14. The integrated circuit according to claim 11, wherein the first and the second conductive structures are arranged in different layers of the capacitor.

15. The integrated circuit according to claim 1, wherein trenches of said plurality of trenches are arranged on positions defined by a trench raster and wherein said at least one second open area is arranged on a position of said trench raster instead of a trench.

16. The integrated circuit according to claim 1, wherein an open area of a trench of said plurality of trenches has a rectangular or square shape.

17. The integrated circuit according to claim 1, wherein at least two trenches of the plurality of trenches comprise an open area, wherein a part of the open area is cut out, and wherein the at least two trenches are arranged such that the cut out parts are directed towards each other and form a part of said at least one second open area.

18. A chip, comprising:
a substrate;
an integrated circuit integrated into said substrate;
an integrated capacitor integrated into said substrate, the integrated capacitor comprising:
a doped area of said substrate that forms a first electrode of said capacitor;
a plurality of trenches arranged in said doped area of said substrate, said plurality of trenches forming a second electrode of said capacitor;
a dielectric layer arranged between each of said plurality of said trenches and said doped area for electrically insulating said trenches from said doped area; and
at least one substrate contact structure for electrically connecting said doped area,
wherein said doped area comprises first open areas arranged between neighboring trenches of said plurality of trenches and at least one second open area arranged between neighboring trenches of said plurality of trenches, wherein said at least one second open area is arranged below said at least one substrate contact, and wherein a shortest first distance between said neighboring trenches separated by said first open areas is shorter than a shortest second distance between said neighboring trenches separated by said at least one second open area, wherein no other trench is arranged in said substrate between said neighboring trenches separated by said first open areas, and wherein no other trench is arranged in said substrate between said neighboring trenches separated by said at least one second open area.

19. A method for producing a capacitor, the method comprising:
forming a trench in a semiconductor substrate;
forming a first electrode by doping said semiconductor substrate;
forming a plurality of trenches in the semiconductor substrate;
forming an electrically insulating layer within said plurality of trenches;
filling the plurality of trenches with an electrically conductive material, the electrically insulating material separating the electrically conductive material from a doped area of the first electrode; and
forming a first substrate contact structure for electrically contacting the first electrode, wherein the plurality of trenches are arranged in such a manner that said doped area comprises first open areas arranged between neighboring trenches of said plurality of trenches and at least one second open area arranged between neighboring trenches of said plurality of trenches, wherein said at least one second open area is arranged below said at least one substrate contact structure and wherein a shortest first distance between neighboring trenches separated by said first open areas is shorter than a shortest second distance between neighboring trenches separated by said at least one second open area, wherein no other trench is arranged in said substrate between said neighboring trenches separated by said first open areas, and wherein no other trench is arranged in said substrate between said neighboring trenches separated by said at least one second open area.

* * * * *